(12) United States Patent
Otsuka et al.

(10) Patent No.: US 7,542,318 B2
(45) Date of Patent: Jun. 2, 2009

(54) CAPACITOR MOUNTING TYPE INVERTER UNIT HAVING A RECESSED COVER

(75) Inventors: Hiroshi Otsuka, Wako (JP); Fumio Anraku, Wako (JP); Masami Nakamura, Wako (JP); Yasuyuki Danjo, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 194 days.

(21) Appl. No.: 11/442,146

(22) Filed: May 30, 2006

(65) Prior Publication Data

US 2007/0002594 A1    Jan. 4, 2007

(30) Foreign Application Priority Data

Jun. 29, 2005    (JP) .............................. 2005-189769

(51) Int. Cl.
    *B63H 23/24*    (2006.01)
(52) U.S. Cl. ...................................... 363/178; 62/259.2
(58) Field of Classification Search ................. 363/178; 62/259.2
    See application file for complete search history.

(56) References Cited

U.S. PATENT DOCUMENTS

| | | | | |
|---|---|---|---|---|
| 6,499,306 B2 * | 12/2002 | Gillen | ......................... | 62/129 |
| 2002/0038550 A1 * | 4/2002 | Gillen | ......................... | 62/3.7 |
| 2003/0200761 A1 * | 10/2003 | Funahashi et al. | .......... | 62/228.4 |
| 2004/0179341 A1 * | 9/2004 | Kimoto et al. | .............. | 361/704 |
| 2005/0223727 A1 * | 10/2005 | Funahashi et al. | .......... | 62/228.4 |

FOREIGN PATENT DOCUMENTS

JP    2000-152662    5/2000

* cited by examiner

*Primary Examiner*—Akm E Ullah
*Assistant Examiner*—Arun Williams
(74) *Attorney, Agent, or Firm*—Westerman, Hattori, Daniels & Adrian, LLP.

(57) ABSTRACT

Disclosed herein is a capacitor mounting type inverter unit having a cooling block, an inverter including a plurality of phases of switching circuits provided on the cooling block, and a smoothing capacitor. The inverter unit includes a cover having a first recess for accommodating the inverter and a second recess for accommodating the smoothing capacitor. The second recess has a depth larger than that of the first recess. The second recess is filled with resin in the condition where the smoothing capacitor is accommodated in the second recess.

8 Claims, 30 Drawing Sheets

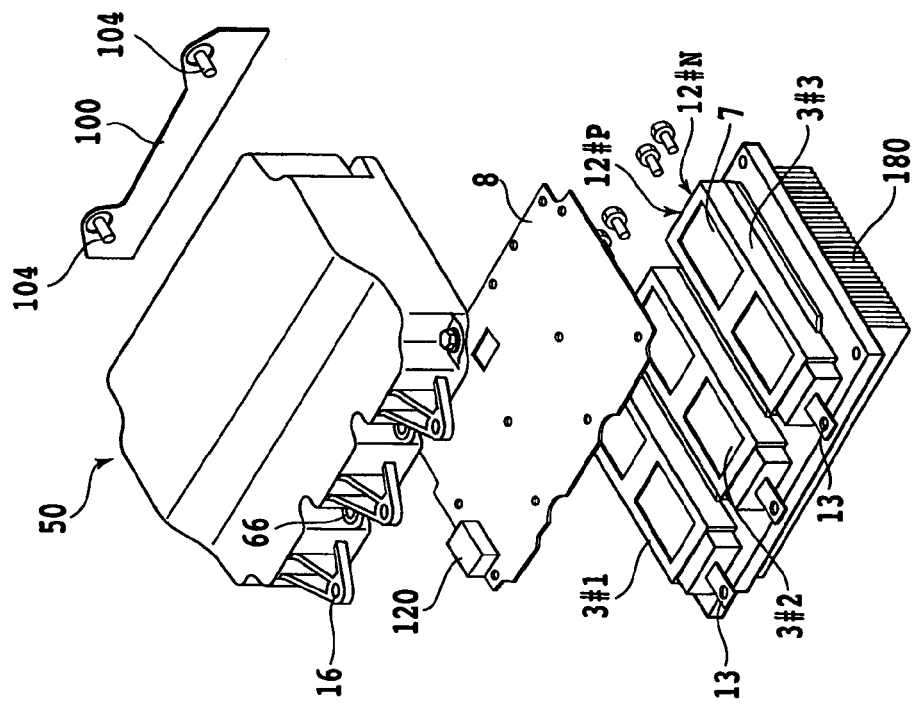
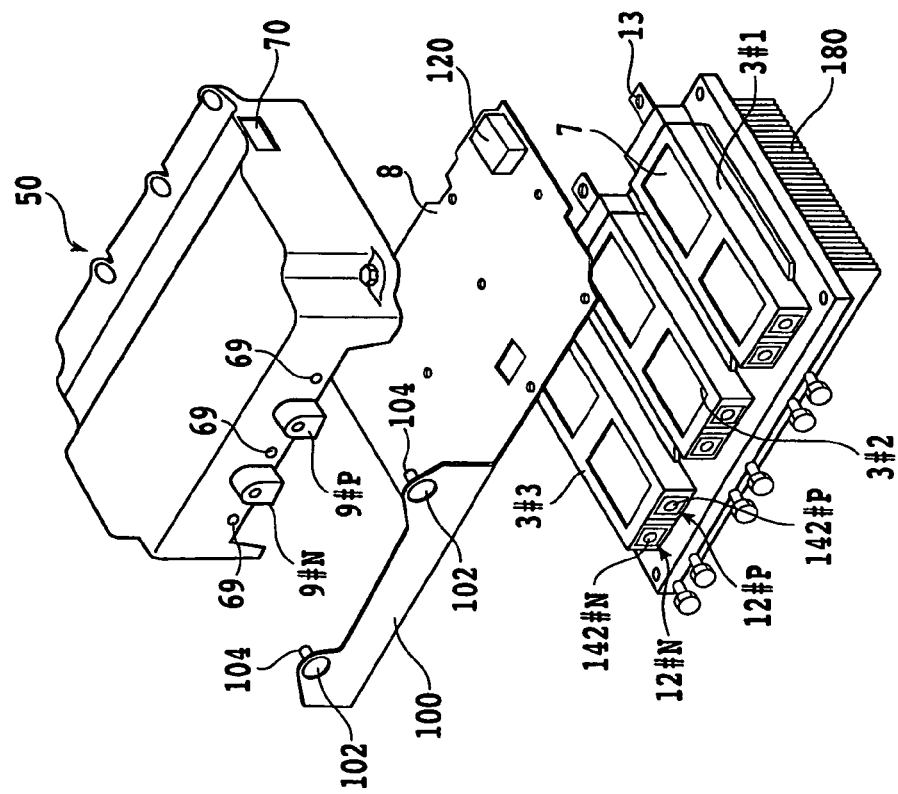

US 7,542,318 B2

CAPACITOR MOUNTING TYPE INVERTER UNIT HAVING A RECESSED COVER

BACKGROUND OF THE INVENTION

1. Field of the Invention

The present invention relates to a capacitor mounting type inverter unit for controlling a driving motor in an electric vehicle or a hybrid vehicle, for example.

2. Description of the Related Art

A capacitor mounting type inverter unit includes a smoothing capacitor for smoothing a voltage from a high-voltage battery, three phases of switching modules (which will be hereinafter referred to as "SW modules") for outputting a three-phase AC voltage according to an output voltage from the smoothing capacitor, a SW module control board for controlling the switching of the SW modules, and an electronic control unit (which will be hereinafter referred to as "control ECU") for controlling the SW module control board. The combination of the SW modules and the SW module control board will be hereinafter referred to as "inverter", and the combination of the inverter and additional components including the smoothing capacitor will be hereinafter referred to as "inverter unit". Related structures of such a capacitor mounting type inverter unit are described in the following Related arts 1, 2, and 3, for example.

FIG. 18 is a perspective view showing the structure of a capacitor mounting type inverter unit 212a described in Japanese Patent Laid-open No. 2000-152662 as Related art 1. The inverter unit 212a includes a smoothing capacitor 213a and an inverter 215a formed independently of the smoothing capacitor 213a. The smoothing capacitor 213a is fixedly mounted on the inverter 215a by screws. The smoothing capacitor 213a is retained by a capacitor retaining component 280a.

The smoothing capacitor 213a is connected to positive and negative electrodes through input terminal bases 208a#P and 208a#N formed on the inverter 215a and bus bars 214a#P and 214a#N formed through an insulating member. The inverter 215a is connected to the input terminal bases 208a#P and 208a#N through bus bars formed independently of the bus bars 214a#P and 214a#N. Further, current sensors are connected through dedicated bus bars to output bus bars of the inverter.

FIG. 19 is a circuit diagram showing Related art 2. As shown in FIG. 19, input lines 202b#P and 202b#N are connected to the positive and negative electrodes of a battery 200b, respectively. Reference numeral 206b generally denotes a noise absorbing capacitor having two capacitors 250b. The positive electrode of one of the capacitors 250b is connected through a lead wire 252b#P, a conduction board 253b, and a bus bar 254b#P to the input line 202b#P. The negative electrode of the other capacitor 250b is connected through a lead wire 252b#N, the conduction board 253b, and a bus bar 254b#N to the input line 202b#N. The other electrodes of the capacitors 250b are grounded through a lead wire 256b, a conduction board 257b, and a ground line 258b.

Reference numeral 212b generally denotes an inverter unit having input terminal bases 208b#P and 208b#N, a smoothing capacitor 213b, input bus bars 214b#P and 214b#N, SW module input bus bars 216b#P and 216b#N, SW modules 222b#i (i=1, 2, 3), a SW module control board 228b, a control ECU 230b, and output terminal bases 231b.

The input terminal bases 208b#P and 208b#N are connected to the input bus bars 214b#P and 214b#N, respectively. The smoothing capacitor 213b is connected through lead wires 260b#P and 260b#N and a conduction board 261b to the input bus bars 214b#P and 214b#N. The SW modules 222b#i (i=1, 2, 3) are connected through the input bus bars 216b#P and 216b#N to the input bus bars 214b#P and 214b#N.

The output terminal bases 231b are connected through output bus bars 274b#i (i=1, 2, 3) to SW module output bus bars 270b#i (i=1, 2, 3). A motor 236b is connected through output lines 234b to the output terminal bases 231b. Current sensors 232b#i (i=1, 2, 3) are provided so that the output lines 234b extend through the current sensors 232b#i (i=1, 2, 3) for the purpose of detecting currents flowing in the output lines 234b. The SW modules 222b#i (i=1, 2, 3) are controlled through the SW module control board 228b by the control ECU 230b.

FIGS. 20 to 30 show the structure of the capacitor mounting type inverter unit 212b in Related art 2 mentioned above. As shown in FIG. 20, the inverter unit 212b is covered with a separate cover 300b. The inverter unit 212b is connected to the noise absorbing capacitor 206b as a separate component. As shown in FIG. 21, the smoothing capacitor 213b is accommodated in a capacitor holding stay 302b. The smoothing capacitor 213b is composed of a plurality of capacitors, each of which is connected to a lead wire 260b shown in FIG. 22, surrounded by a potting resin 310b, and held by a capacitor holding case 312b. As shown in FIG. 23, the smoothing capacitor 213b is connected through the lead wires 260b and the conduction board 261b to the input bus bars 214b#P and 214b#N.

As shown in FIGS. 21 and 24, the smoothing capacitor 213b, the SW modules 222b, and the SW module control board 228b are accommodated in an inverter case 304b independent of the inverter cover 300b. As shown in FIG. 25, each SW module 222b is connected to the corresponding SW module input bus bars 216b#P and 216b#N and the corresponding SW module output bus bar 270b. As shown in FIG. 26, the SW module input bus bars 216b#P and 216b#N are connected to the input bus bars 214b#P and 214b#N, respectively. Each SW module output bus bar 270b is connected to the corresponding output bus bar 274b, which is in turn connected to the corresponding output terminal base 231b. As shown in FIG. 27, the output lines 234b are inserted through the respective current sensors 232b#i (i=1, 2, 3) independent of the inverter unit 212b and fixedly connected to the respective output terminal bases 231b by screws 320b.

As shown in FIGS. 28 and 29, the noise absorbing capacitors 250b are partially covered with a potting resin 352b and held in a holding case 350b. The opposite electrodes of the cascaded noise absorbing capacitors 250b are connected through the lead wires 252b and the conduction board 253b to the bus bars 254b. The holding case 350b is accommodated in a case 356b independent of the inverter unit 212b. The bus bars 254b are connected to terminals of the case 356b, and a ground harness 258b is connected to a terminal 358b of the case 356b.

FIGS. 31 and 32 show the structure of a capacitor mounting type inverter unit 212c in Related art 3. As shown in FIG. 31, a smoothing capacitor 213c is held and accommodated in a holding component 320c. The electrodes of the smoothing capacitor 213c are connected through a bus bar 214c to SW modules. The output bus bars of the SW modules are connected through output lines 234c to output bus bars 274c. The output bus bars 274c are connected through current sensors 232c to output terminal bases 231c. The output lines 234c are connected to the respective output terminal bases 231c. The output terminal bases 231c are formed on a case independent of a case for accommodating the inverter unit 212c. As shown in FIG. 32, a noise absorbing capacitor 250c is formed independently of the smoothing capacitor 213c and is accommodated in a case 350c. The noise absorbing capacitor 250c is connected through bus bars 254c#P and 254c#N and a ground harness 258c to a terminal of a case 356c.

In Related arts 1 to 3, however, the number of electrical connection parts such as lead wires and bus bars and the number of electrical connection points of such parts are large, causing an increase in electrical contact resistance, number of assembling steps, volume, weight, and cost. Further, in Related arts 1 to 3, it is necessary to provide dedicated components for holding the smoothing capacitor and the noise absorbing capacitor. Accordingly, the number of such capacitor holding components is large, causing an increase in number of assembling steps, volume, weight, and cost.

In the case that the current sensor is integrated with the inverter unit in Related art 1, it is necessary to provide a dedicated bus bar (bus bar between the inverter and the output line) for passing a current through the current sensor. In Related art 3, the current sensors 232c are formed independently of the inverter unit as shown in FIG. 31, and the bus bars 274c and the output terminal bases 231c are therefore necessary.

In the case that no bus bars like the bus bars 274c are set as shown in FIG. 27, it is necessary to perform the work of inserting the output lines 234c through the current sensors 232b and then fastening the output lines 234 to the output terminal bases 231b by using the screws 320b. Thus, Related arts 1 to 3 have the problem that the number of parts, the number of assembling steps, the volume, weight, and cost are increased.

SUMMARY OF THE INVENTION

It is therefore an object of the present invention to provide a capacitor mounting type inverter unit which can reduce the number of parts, the number of assembling steps, the volume, weight, and cost.

In accordance with a first aspect of the present invention, there is provided a capacitor mounting type inverter unit having a cooling block, an inverter including a plurality of phases of switching circuits provided on the cooling block, and a smoothing capacitor. The inverter unit includes a cover having a capacitor accommodating recess for accommodating the smoothing capacitor; the capacitor accommodating recess being filled with resin in the condition where the smoothing capacitor is accommodated in the capacitor accommodating recess. With this configuration, the smoothing capacitor is accommodated in the cover, so that the number of parts and the number of working steps can be reduced.

In accordance with a second aspect of the present invention, the cover has an inverter accommodating recess for accommodating the inverter; the capacitor accommodating recess having a depth larger than that of the inverter accommodating recess. With this configuration, the inverter and the smoothing capacitor are accommodated in the cover, so that the number of parts and the number of working steps can be reduced.

In accordance with a third aspect of the present invention, the inverter unit further includes a platelike first conductive member connected to the positive electrode of the smoothing capacitor and a plurality of positive electrode connecting portions of the switching circuits; and a platelike second conductive member connected to the negative electrode of the smoothing capacitor and a plurality of negative electrode connecting portions of the switching circuits; the first conductive member having a plurality of first inverter connecting portions adapted to be connected to the positive electrode connecting portions of the switching circuits, respectively; the second conductive member having a plurality of second inverter connecting portions adapted to be connected to the negative electrode connecting portions of the switching circuits, respectively; the first inverter connecting portions and the second inverter connecting portions being arranged in the vicinity of one side surface of the cover. With this configuration, each of the first and second conductive members is provided by a single member, so that the number of parts, the electrical contact resistance, and the number of soldering points can be reduced.

In accordance with a fourth aspect of the present invention, the cover has a first side surface integrally formed with a first input terminal base having a positive electrode connecting portion adapted to be connected to the positive electrode of a DC power supply and also integrally formed with a second input terminal base having a negative electrode connecting portion adapted to be connected to the negative electrode of the DC power supply; the first conductive member having a first input power connecting portion adapted to be connected to the positive electrode connecting portion of the first input terminal base; the second conductive member having a second input power connecting portion adapted to be connected to the negative electrode connecting portion of the second input terminal base. With this configuration, the first side surface of the cover is integrally formed with the first and second input terminal bases, which are respectively connected to the first and second conductive members. Accordingly, it is not necessary to provide any separate input terminal bases, so that the number of parts and the number of working steps can be reduced.

In accordance with a fifth aspect of the present invention, the inverter unit further includes a noise absorbing capacitor accommodated in the capacitor accommodating recess; the noise absorbing capacitor being connected in parallel to the smoothing capacitor by the first conductive member and the second conductive member. With this configuration, the smoothing capacitor and the noise absorbing capacitor are assembled as a unit, and they are accommodated and fixed in the capacitor accommodating recess of the cover, so that the number of parts and the number of working steps can be reduced.

In accordance with a sixth aspect of the present invention, the noise absorbing capacitor includes a plurality of cascaded capacitors; the inverter unit further including a platelike intermediate conductive member connected to the electrodes of the capacitors except the opposite ones thereof; the intermediate conductive member having a first hole adapted to be aligned with a second hole of a grounding terminal provided at a peripheral portion of the cover; the intermediate conductive member being connected and fixed to the cooling block by a ground connection conductive member inserted through the first hole and the second hole. With this configuration, the grounding length can be minimized and the number of working steps can be reduced.

In accordance with a seventh aspect of the present invention, the inverter unit further includes a plurality of platelike inverter output conductive members respectively connected to the output terminals of the switching circuits, each of the inverter output conductive members having an inverter output connecting portion; the cover having a second side surface different from the first side surface, the second side surface being integrally formed with a plurality of output terminal bases each having a motor connecting portion adapted to be connected to a motor; the motor connecting portions of the output terminal bases being connected to the inverter output connecting portions of the inverter output conductive members, respectively. With this configuration, the second side surface of the cover is integrally formed with the output terminal bases, which are respectively connected to the output terminals of the inverter and also connected to the motor. Accordingly, it is not necessary to provide any separate output terminal bases, so that the number of parts and the number of working steps can be reduced.

In accordance with an eighth aspect of the present invention, the cooling block includes a heat sink having a flat metal plate and a plurality of fins provided on the flat metal plate; the cover having a flange closely attached and fixed to a peripheral portion of the flat metal plate of the heat sink. With this configuration, the number of parts can be reduced and the shape of the heat sink can be made simple.

In accordance with a ninth aspect of the present invention, the inverter unit further includes positioning means for positioning the intermediate conductive member in the vicinity of the second hole of the cover. With this configuration, the positioning means is provided on the cover, so that the misalignment of the intermediate conductive member can be prevented.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIGS. 2A and 2B are exploded perspective views of the inverter unit, showing the components thereof;

DETAILED DESCRIPTION OF THE PREFERRED EMBODIMENTS

Figure 1:
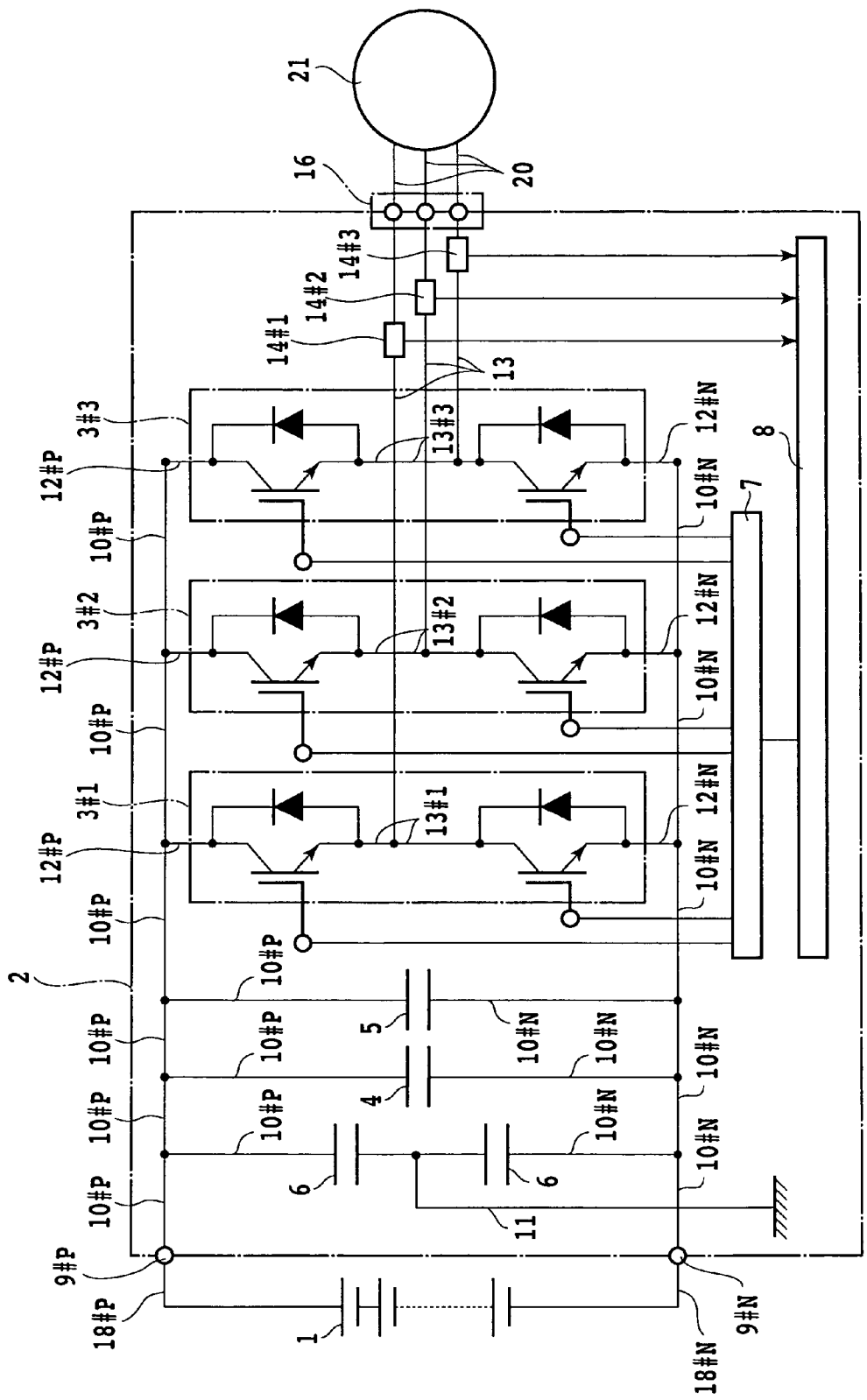
FIG. 1 is a circuit diagram of a capacitor mounting type inverter unit according to a preferred embodiment of the present invention.

FIG. 1 is a circuit diagram showing a capacitor mounting type inverter unit 2 adapted to be provided in an electric vehicle or a hybrid vehicle, for example. As shown in FIG. 1, input lines 18#P and 18#N are connected to the positive and negative electrodes of a battery 1, respectively. The input lines 18#P and 18#N are connected to the inverter unit 2. The inverter unit 2 includes a plurality of phases (e.g., three phases) of SW modules 3#i (i=1, 2, 3), a plurality of smoothing capacitors 4 connected in parallel to each other, a noise absorbing capacitor (C snubber) 5 connected in parallel to the smoothing capacitors 4, a plurality of (e.g., two) noise absorbing capacitors 6 cascaded each other and connected in parallel to the smoothing capacitors 4, a SW module control board 7, a control ECU 8, input terminal bases 9#P and 9#N, input bus bars 10#P and 10#N, a ground line 11, SW module input bus bars 12#P and 12#N, SW module output bus bars 13#i (i=1, 2, 3), current sensors 14#i (i=1, 2, 3), and a plurality of (e.g., three) output terminal bases 16.

The input terminal bases 9#P and 9#N are connected to the input lines 18#P and 18#N, respectively. The input bus bars 10#P and 10#N are connected to the input terminal bases 9#P and 9#N, respectively. The positive electrode of one of the noise absorbing capacitors 6 is connected to the input bus bar 10#P, and the negative electrode of the other noise absorbing capacitor 6 is connected to the input bus bar 10#N. The other electrodes of the two capacitors 6 are connected to the ground line 11. The ground line 11 is grounded. The positive electrode of each smoothing capacitor 4 is connected to the input bus bar 10#P, and the negative electrode of each smoothing capacitor 4 is connected to the input bus bar 10#N.

The three phases of SW modules 3#i (i=1, 2, 3) are provided by three phases of inverter circuits each having an upper arm and a lower arm, each arm being configured by an IGBT module composed of an IGBT element (switching element) and a freewheeling diode connected in parallel to each other. The IGBT module constituting the upper arm is connected in series to the IGBT module constituting the lower arm, thus constituting each inverter circuit. In each of the SW modules 3#i (i=1, 2, 3), the collector of the IGBT element and the cathode of the freewheeling diode in the IGBT module constituting the upper arm are connected to the corresponding SW module input bus bar 12#P, which is connected to the input bus bar 10#P.

In each of the SW modules 3#i (i=1, 2, 3), the emitter of the IGBT element and the anode of the freewheeling diode in the IGBT module constituting the lower arm are connected to the corresponding SW module input bus bar 12#N, which is connected to the input bus bar 10#N. All the gates of the IGBT elements in the SW modules 3#i (i=1, 2, 3) are connected to the SW module control board 7. The SW module control board 7 is connected to the SW modules 3#i (i=1, 2, 3) and the control ECU 8, and functions to control switching in the SW modules 3#i (i=1, 2, 3) according to instructions from the control ECU 8. The control ECU 8 is connected to the SW module control board 7, and functions to control the SW module control board 7.

In each of the SW modules 3#i (i=1, 2, 3), the emitter of the IGBT element and the anode of the freewheeling diode in the IGBT module constituting the upper arm are connected to the corresponding SW module output bus bar 13#i (i=1, 2, 3), and the collector of the IGBT element and the cathode of the freewheeling diode in the IGBT module constituting the lower arm are connected to the corresponding SW module output bus bar 13#i (i=1, 2, 3). The SW module output bus bars 13#i (i=1, 2, 3) are connected through the current sensors 14#i (i=1, 2, 3) to the three output terminal bases 16, respectively. Three output lines 20 are connected to the three output terminal bases 16. A motor 21 is connected to the three output lines 20.

FIGS. 2A and 2B are exploded perspective views of the inverter unit 2, showing the components thereof. More specifically, FIG. 2A is an exploded perspective view of the inverter unit 2 as viewed from one side thereof where the input terminal bases 9#P and 9#N are formed, and FIG. 2B is an exploded perspective view of the inverter unit 2 as viewed from another side thereof where the output terminal bases 16 are formed. As shown in FIGS. 2A and 2B, the inverter unit 2 has a cooling block (heat sink) 180, the SW modules 3#i (i=1, 2, 3), the SW module control board 7, the control ECU 8, a cover 50, and an auxiliary cover 100. These components are arranged in this order from the lower side of the inverter unit 2.

(1) Structure of the Cover 50

Figure 3:
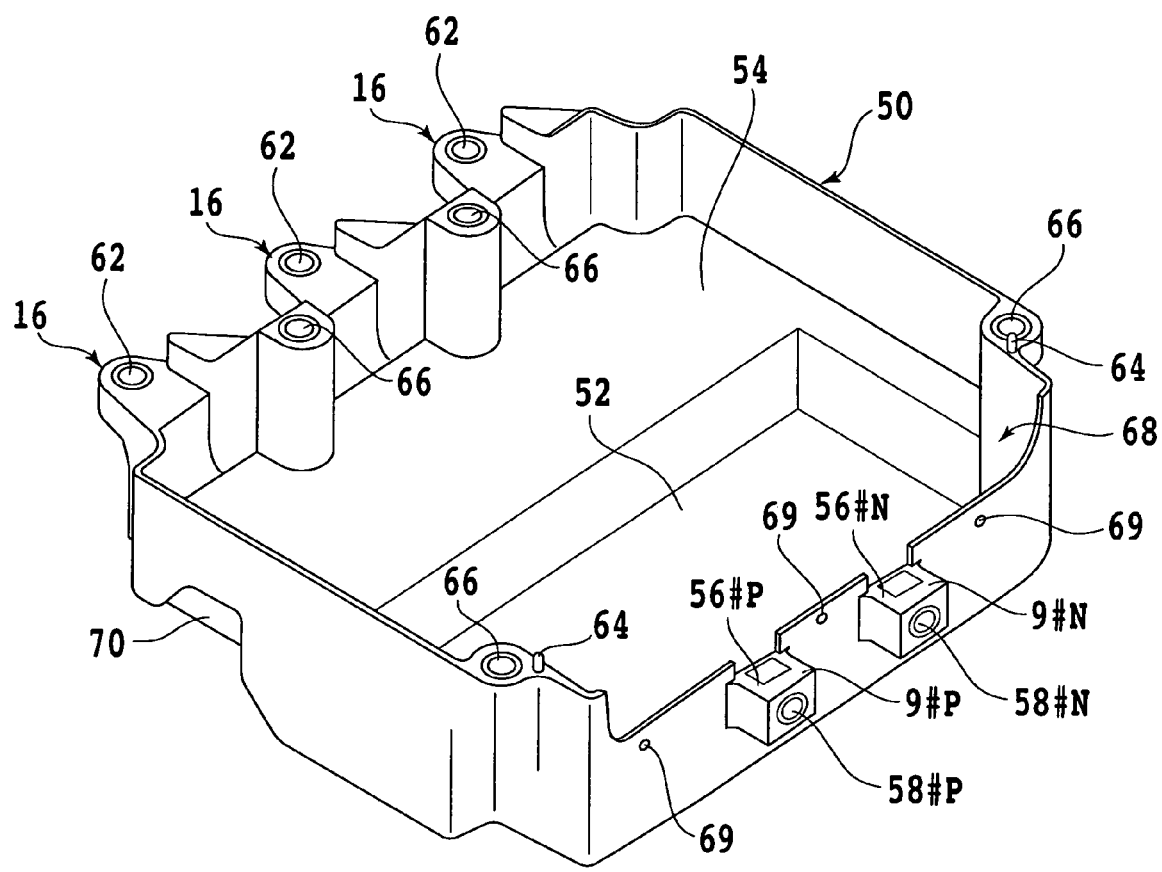
FIG. 3 is a perspective view of a cover.

FIG. 3 is a perspective view of the cover 50 in the condition where it is turned upside down. In mounting the cover 50 on the heat sink 180, the upper side of the cover 50 as viewed in FIG. 3 is placed on the heat sink 180. As shown in FIG. 3, the cover 50 is formed with a recess (capacitor accommodating recess) 52 for accommodating the smoothing capacitors 4, the C snubber 5, and the noise absorbing capacitors 6. The recess 52 is formed in the vicinity of one side (first side) of the cover 50 where the input terminal bases 9#P and 9#N are formed. The cover 50 is further formed with a recess (inverter accommodating recess) 54 for mounting the SW modules 3#i (i=1, 2, 3), the SW module control board 7, and the control ECU 8. The recess 54 is formed in the vicinity of another side (second side) of the cover 50 where the output terminal bases 16 are formed and over the recess 52. The recess 52 has a depth larger than that of the recess 54.

The input terminal bases 9#P and 9#N are formed on the first side of the cover 50 so as to project outward. The input terminal base (first input terminal base) 9#P is formed with a connecting portion 56#P adapted to be connected to the input bus bar 10#P and an input terminal base nut (positive electrode connecting portion) 58#P connected to the connecting portion 56#P and adapted to be connected to the input line 18#P. Similarly, the input terminal base (second input terminal base) 9#N is formed with a connecting portion 56#N adapted to be connected to the input bus bar 10#N and an input terminal base nut (negative electrode connecting portion) 58#N connected to the connecting portion 56#N and adapted to be connected to the input line 18#N.

The output terminal bases 16 are formed on the second side of the cover 50 opposite to the first side so as to project outward and to face the bottom side of the cover 50 (as viewed in the mounted condition). Each output terminal base 16 has an output terminal base nut 62 functioning as a connecting portion (motor connecting portion) adapted to be connected to the corresponding SW module output line 13 and adapted to connect the corresponding SW module output line 13 and a connecting end portion of the corresponding output line 20. That is, a bolt is inserted through holes formed at the end portions of each SW module output line 13 and the corresponding output line 20 into the corresponding output terminal base nut 62 and then tightened to the nut 62, thereby fixedly connecting these members 13, 20, and 62 together.

The bottom surface of the cover 50 (as viewed in the mounted condition) is formed with a plurality of positioning pins 64 at predetermined positions. The positioning pins 64 function to prevent misalignment of the ground line 11 in setting the position of the ground line 11 and fixing the cover 50 to the heat sink 180. The bottom surface of the cover 50 (as viewed in the mounted condition) is further formed with a plurality of cover mounting collars 66 at predetermined positions. The cover mounting collars 66 are provided to fix the cover 50 to the heat sink 180 by using screws or the like. In the case of using the ground connection type noise absorbing capacitors 6, one of the positioning pins 64 and one of the cover mounting collars 66 are used to connect the ground line 11 to the heat sink 180, wherein the ground line 11 is connected to the electrodes of the noise absorbing capacitors 6.

The first side wall of the cover 50 is formed with a window 68 for allowing an operation of connecting the input bus bars 10#P and 10#N to the SW module input bus bars 12#P and 12#N, respectively, by using screws. The window 68 is formed on the lower side of the input terminal bases 9#P and 9#N (as viewed in the mounted condition). Further, another side wall of the cover 50 is formed with a window 68 for allowing the connection to a connector 120 provided on the control ECU 8. The window 68 is so formed as to be opposed to the connector 120. The first side wall of the cover 50 is further formed with a plurality of holes 69 for fixing the auxiliary cover 100 to the cover 50. The holes 69 are formed on the upper side of the window 68 (as viewed in the mounted condition). The cover 50 has a flange (side wall) extending to a mounting surface of the heat sink 180, thereby covering the inverter accommodated in the cover 50 to obtain a dustproof structure for the inverter.

(2) Structure of the Smoothing Capacitors 4

Figure 4:
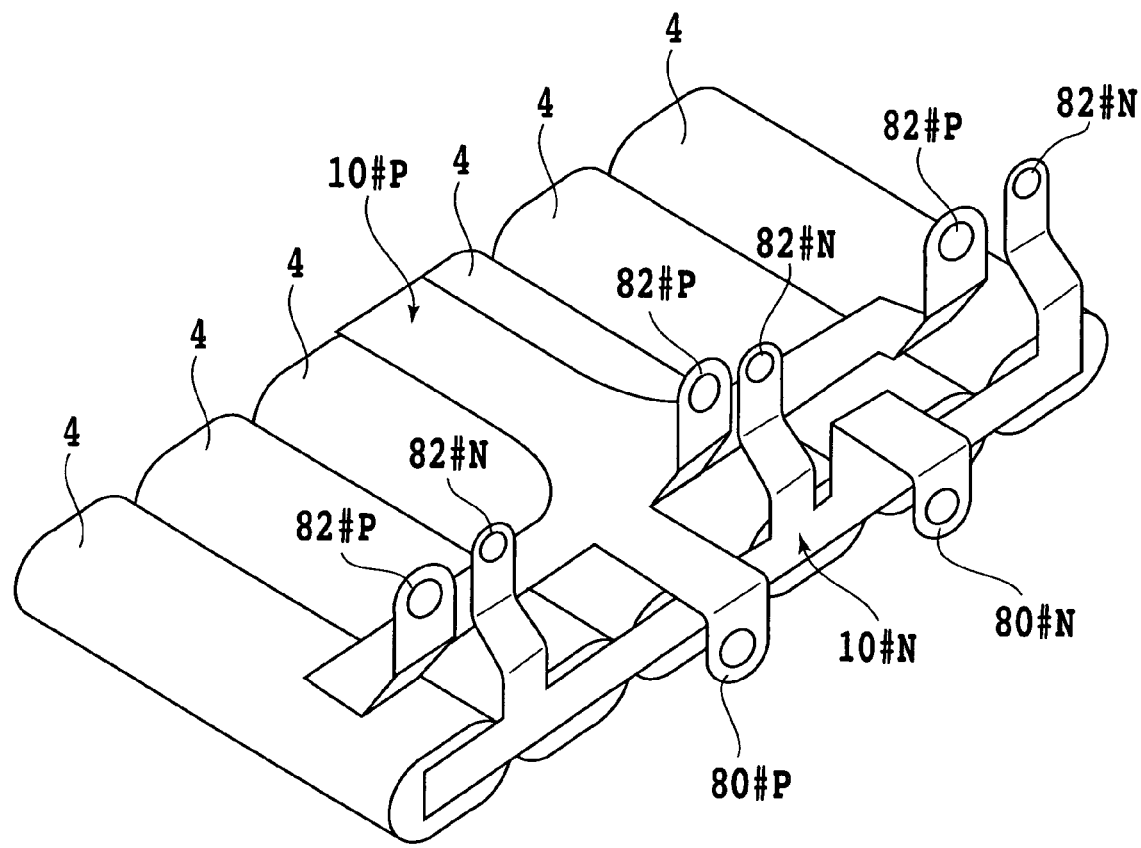
FIG. 4 is a perspective view of smoothing capacitors.

FIG. 4 is a perspective view showing the structure of the smoothing capacitors 4. As shown in FIG. 4, the positive electrode of each smoothing capacitor 4 is connected by soldering to the input bus bar (first conductive member) 10#P, and the negative electrode of each smoothing capacitor 4 is connected by soldering to the input bus bar (second conductive member) 10#N. The input bus bar 10#P is formed from a metal plate, and it has a connecting portion (first input power connecting portion) 80#P adapted to be connected to the input terminal base 9#P and three connecting portions (first inverter connecting portions) 82#P adapted to be connected to the three SW module bus bars 12#P, respectively. The connecting portion 80#P is formed by twice bending the metal plate at right angles upward and downward (as viewed in FIG. 4), and the three connecting portions 82#P are formed by twice bending the metal plate upward (as viewed in FIG. 4). The input bus bar 10#P extends along one side surface of the unit of the plural smoothing capacitors 4 between the opposite electrodes thereof and is bent downward (as viewed in FIG. 4) at right angles near the positive electrodes of the smoothing capacitors 4.

Similarly, the input bus bar 10#N is formed from a metal plate, and it has a connecting portion (second input power connecting portion) 80#N adapted to be connected to the input terminal base 9#N and three connecting portions (second inverter connecting portions) 82#N adapted to be connected to the three SW module bus bars 12#N, respectively. The connecting portion 80#N is formed by twice bending the metal plate at right angles upward and downward (as viewed in FIG. 4), and the three connecting portions 82#N are formed by twice bending the metal plate upward (as viewed in FIG.

4). These connecting portions 82#P and 82#N are collectively arranged in a line in the vicinity of one side surface of the cover 50, e.g., the first side of the cover 50 where the input terminal bases 9#P and 9#N are formed.

Figure 5:
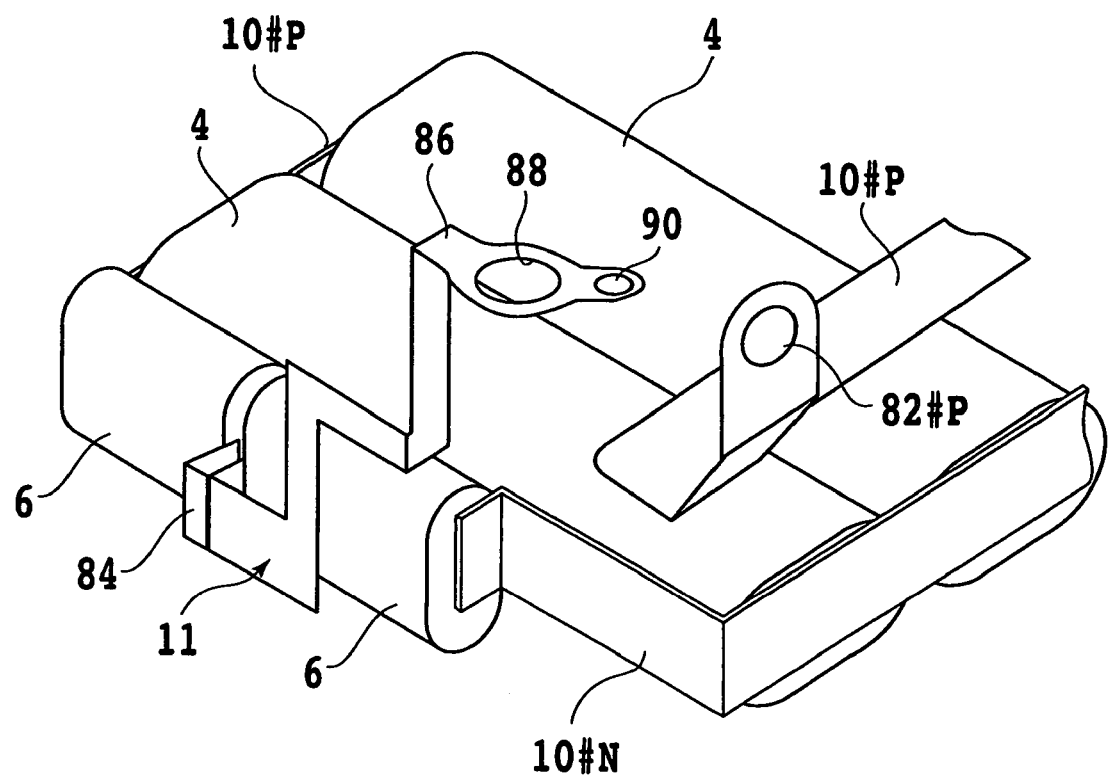
FIG. 5 is a perspective view of ground connection type noise absorbing capacitors.

In the case that the plural (e.g., two) ground connection type noise absorbing capacitors 6 are connected to the inverter unit 2, the noise absorbing capacitors 6 are cascaded each other. As shown in FIG. 5, the input bus bars 10#P and 10#N extend to the opposite electrodes of the cascaded capacitors 6 and are connected by soldering thereto. A connecting member (metal plate) 84 is connected by soldering to the other electrode of one of the capacitors 6, e.g., the capacitor 6 connected to the input bus bar 10#P.

A line 86 is connected by soldering to the other electrode of the other capacitor 6, e.g., the capacitor 6 connected to the input bus bar 10#N. The metal plate 84 and the line 86 are connected by soldering to each other. The line 86 is formed by bending a metal plate, and it has a hole 90 for insertion of the positioning pin 64 of the cover 50 and a hole 88 for location of the mounting collar 66. The metal plate 84 and the line 86 constitute the ground line (intermediate conductive member) 11. As a modification, the line 86 may be connected to both the other electrodes of the capacitors 6 without using the metal plate 84. While the two capacitors 6 are cascaded as shown in FIG. 5, three or more similar capacitors may be cascaded and grounded at the intermediate electrodes. Further, the C snubber 5 may be applied similarly.

Figure 6:
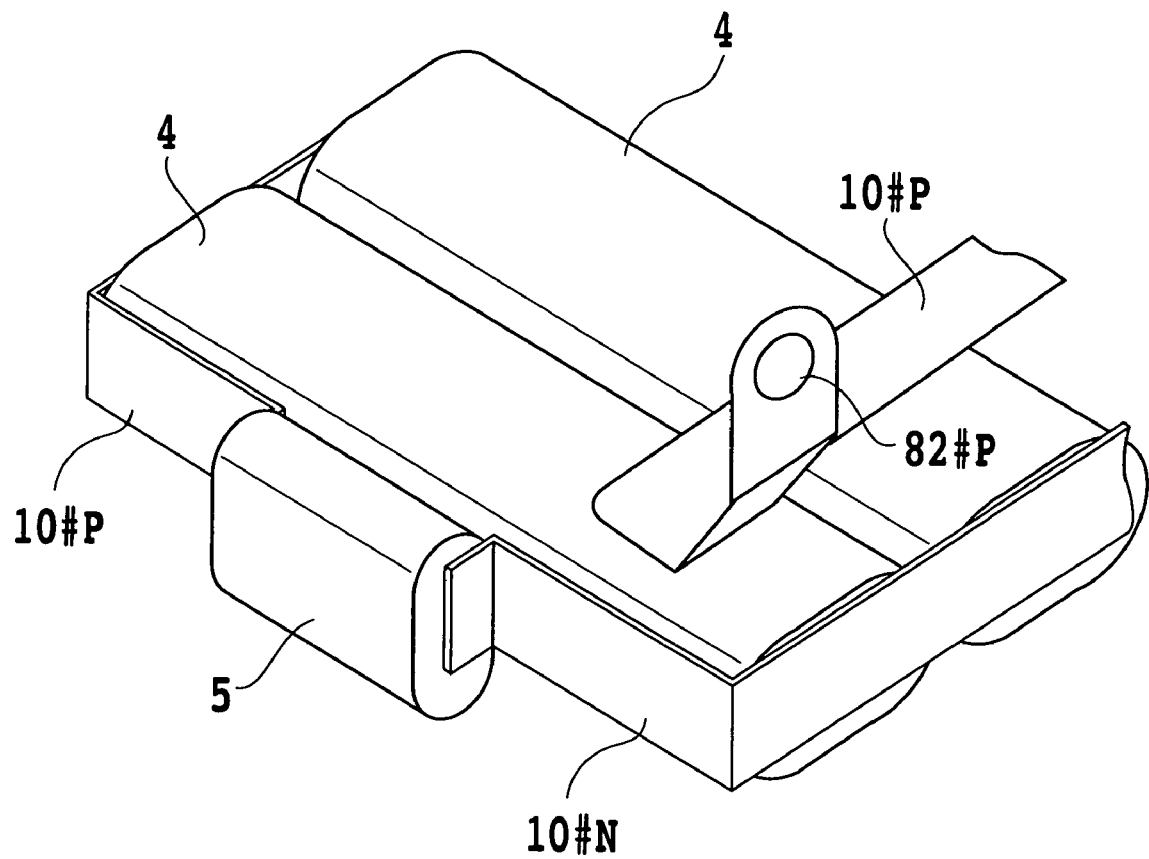
FIG. 6 is a perspective view of a ground disconnection type noise absorbing capacitor (C snubber)

In the case that the C snubber 5 is connected in parallel to the smoothing capacitors 4 as shown in FIG. 6, the input bus bars 10#P and 11#N extend to the positive and negative electrodes of the C snubber 5 and are connected by soldering thereto.

(3) Mounting of the Smoothing Capacitors 4 to the Cover 50

Figure 8:
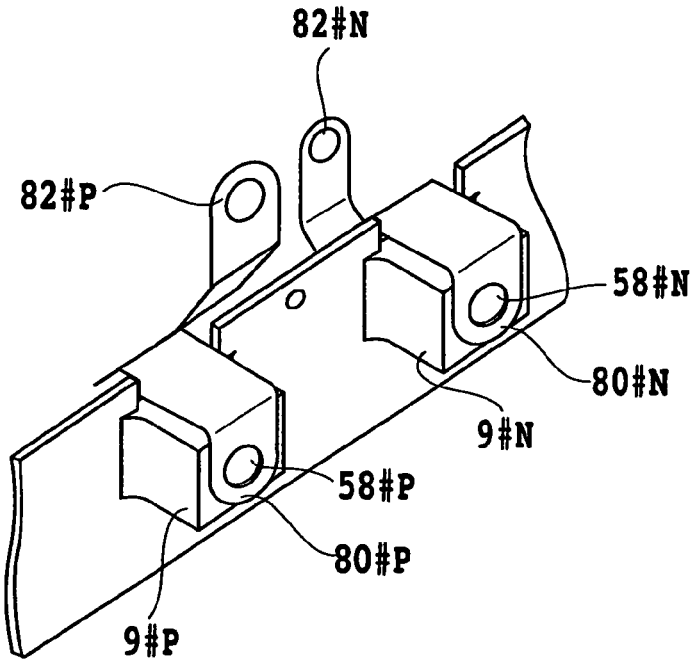
FIG. 8 is a perspective view showing the connection of input terminal bases and input bus bars.
Figure 9:
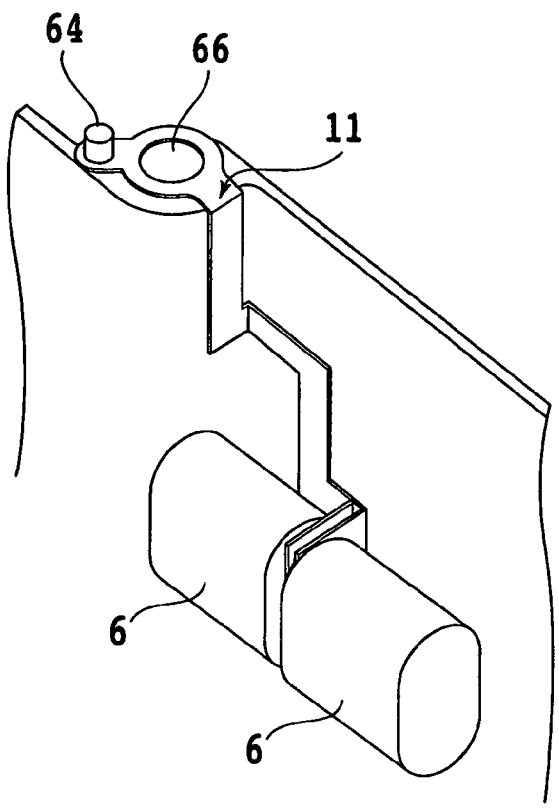
FIG. 9 is a perspective view showing the mounting of the noise absorbing capacitors shown in FIG. 5 to the cover.

The smoothing capacitors 4 are located at a predetermined position in the recess 52 of the cover 50 in such a manner that the connecting portions 80#P and 80#N of the input bus bars 10#P and 10#N connected to the capacitors 4 shown in FIGS. 4 to 6 are connected to the input terminal bases 9#P and 9#N, respectively, as shown in FIG. 8. In the case that the ground connection type noise absorbing capacitors 6 shown in FIG. 5 are used, the positioning pin 64 of the cover 50 is inserted into the hole 90 of the ground line 11, thereby aligning the hole 88 of the ground line 11 to the mounting collar 66 of the cover 50.

Figure 7:
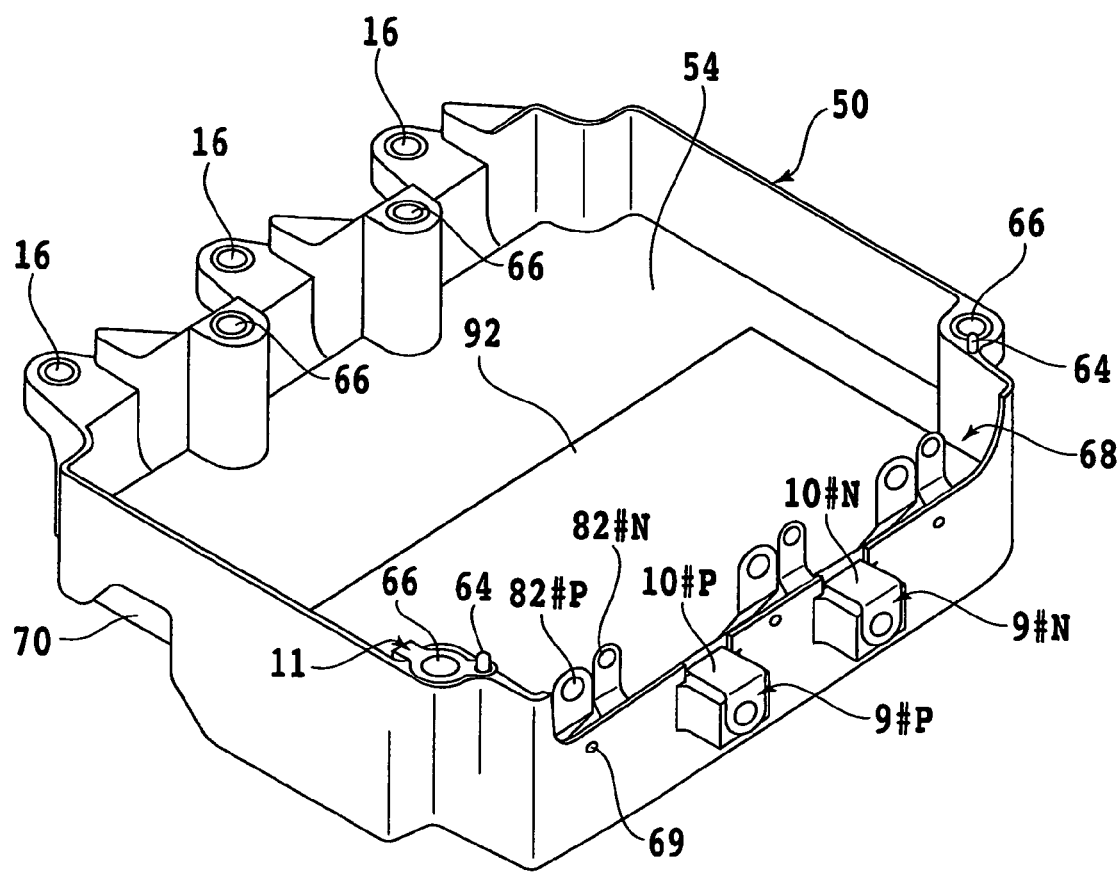
FIG. 7 is a perspective view of the cover in the condition where the capacitors shown in FIGS. 4, 5, and 6 are accommodated in the cover.

In the condition where the capacitors 4 are set in the recess 52 of the cover 50, a potting resin 92 is filled into the recess 52 until the upper surface of the potting resin 92 becomes flush with the bottom surface of the recess 54 as shown in FIG. 7. When the potting resin 92 is cured, the capacitors 4 are firmly held in the cover 50 in an insulated condition. The connecting portions 80#P and 80#N of the input bus bars 10#P and 10#N are connected to the input terminal bases 9#P and 9#N, respectively. The connecting portions 82#P and 82#N of the input bus bars 10#P and 10#N are opposed to the window 68 of the cover 50 and are arranged in a line.

(4) Structure of the SW Modules 3#i (i=1, 2, 3)

Figure 10:
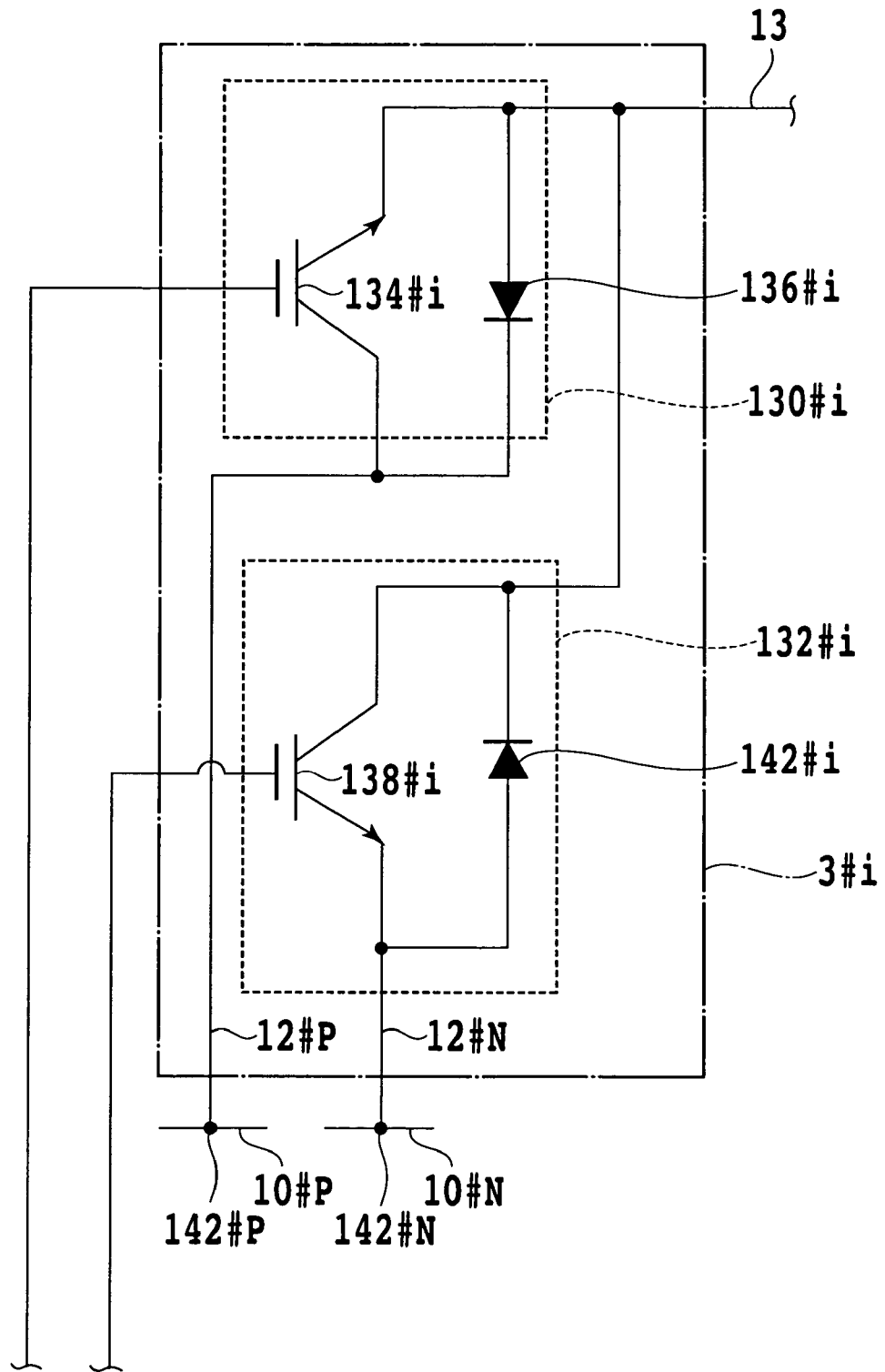
FIG. 10 is a circuit diagram showing the connection of a SW module.

The three SW modules 3#i (i=1, 2, 3) are individually formed in this preferred embodiment. As a modification, the three SW modules 3#i (i=1, 2, 3) may be integrated. As shown in FIG. 10, the collector of an IGBT element 134#i in an IGBT module 130#i constituting the upper arm of each SW module 3#i is located near to the collector of an IGBT element 138#i in an IGBT module 132#i constituting the lower arm of the same SW module 3#i. Further, the cathode of a freewheeling diode 136#i in the IGBT module 130#i is opposed to the cathode of a freewheeling diode 140#i in the IGBT module 132#i.

Each SW module input bus bar 12#P is formed from a metal plate, and it is connected to the corresponding IGBT module 130#i. Similarly, each SW module input bus bar 12#N is formed from a metal plate, and it is connected to the corresponding IGBT module 132#i. The three SW module input bus bars 12#P have three connecting portions (positive electrode connecting portions) 142#P adapted to be connected to the three connecting portions 82#P of the input bus bar 10#P, respectively. Similarly, the three SW module input bus bars 12#N have three connecting portions (negative electrode connecting portions) 142#N adapted to be connected to the three connecting portions 82#N of the input bus bar 10#N, respectively. These three connecting portions 142#P and these three connecting portions 142#N are arranged in a line.

The three SW module output bus bars (inverter output conductive members) 13 extend through the three current sensors 14#i (i=1, 2, 3), respectively, and each SW module output bus bar 13 is formed from a metal plate. The SW module output bus bars 13 are connected to the output terminals of the SW modules 3#i (i=1, 2, 3), respectively, and each SW module output bus bar 13 is formed at its outer end with a connecting portion (inverter output connecting portion) 144 adapted to be connected to the output terminal base nut 62 of each output terminal base 16. The SW modules 3#i (i=1, 2, 3) are connected to the output terminals of the SW module control board 7 by soldering.

(5) Mounting of the SW Modules 3#i (i=1, 2, 3)

The SW modules 3#i (i=1, 2, 3) connected to the SW module control board 7 are located at predetermined positions on the heat sink 180, and are fixed thereto by screws. The control ECU 8 is next mounted at a predetermined position on the SW module control board 7, and is connected thereto by soldering.

(6) Mounting of the Cover 50

Figure 11:
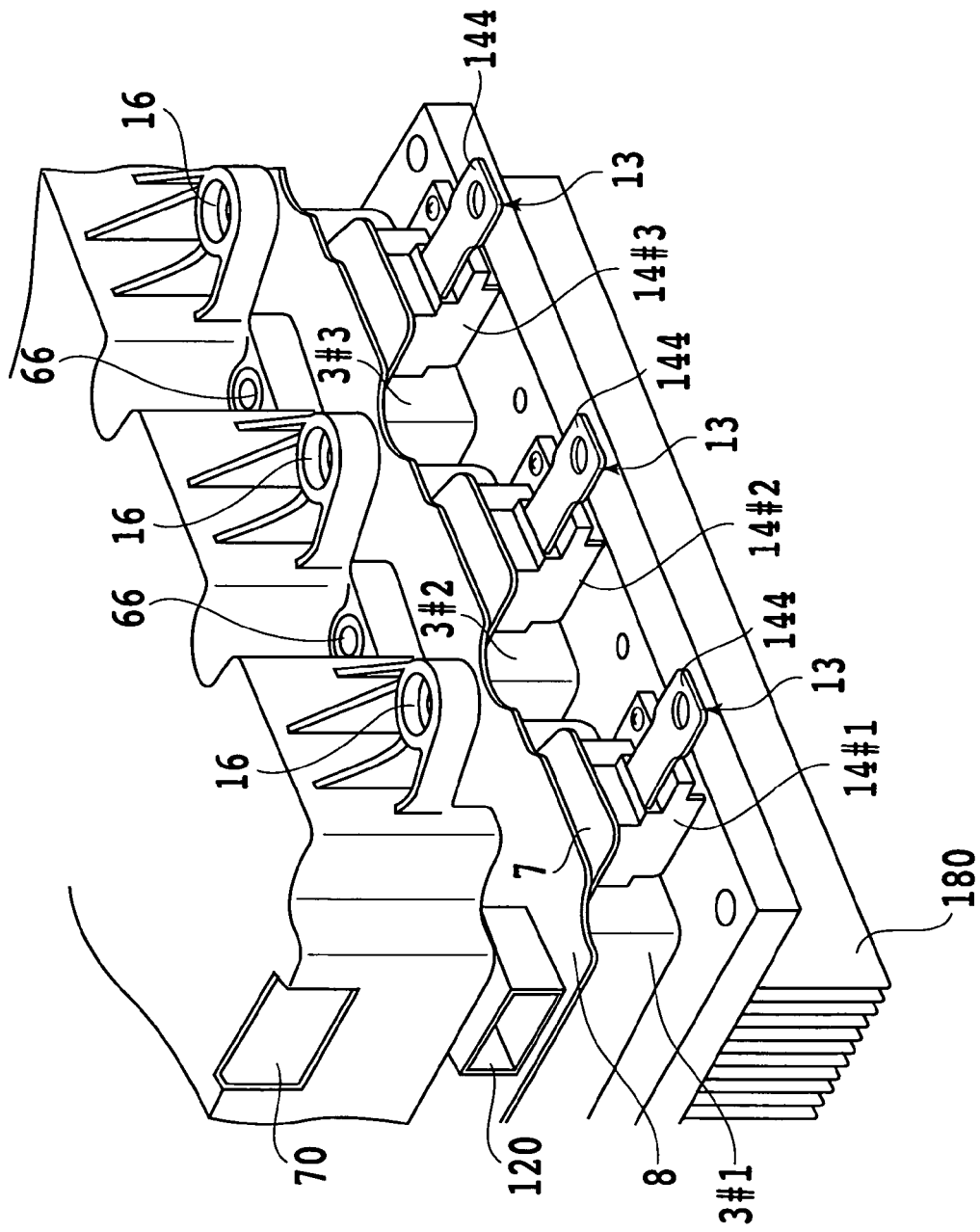
FIG. 11 is a perspective view showing the connection of output terminal bases and SW module output bus bars.
Figure 12:
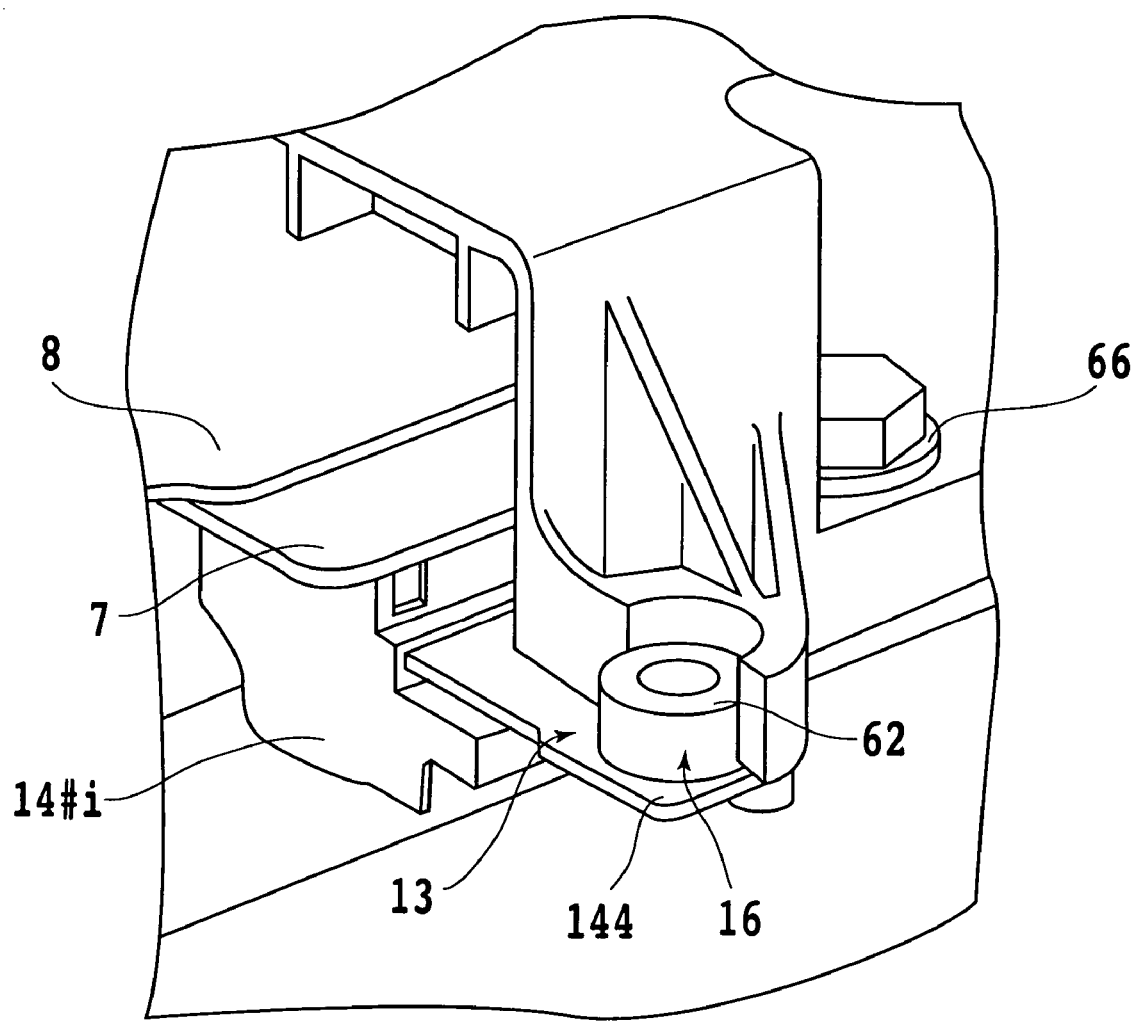
FIG. 12 is an enlarged perspective view showing the connection of each output terminal base and the corresponding SW module output bus bar.

The positioning pins 64 of the cover 50 are inserted into given holes formed on the mounting surface of the heat sink 180. The connecting portions 82#P and 82#N of the input bus bars 10#P and 10#N are connected by screws to the connecting portions 142#P and 142#N of the SW module input bus bars 12#P and 12#N, respectively. As shown in FIGS. 11 and 12, the second side of the cover 50 where the output terminal bases 16 are formed are fixed to the heat sink 180 by inserting screws through the holes of the mounting collars 66 into given tapped holes formed on the mounting surface of the heat sink 180. At this time, the nuts 62 in the output terminal bases 16 are connected to the connecting portions 144 of the SW module output bus bars 13#i (i=1, 2, 3).

Figure 13:
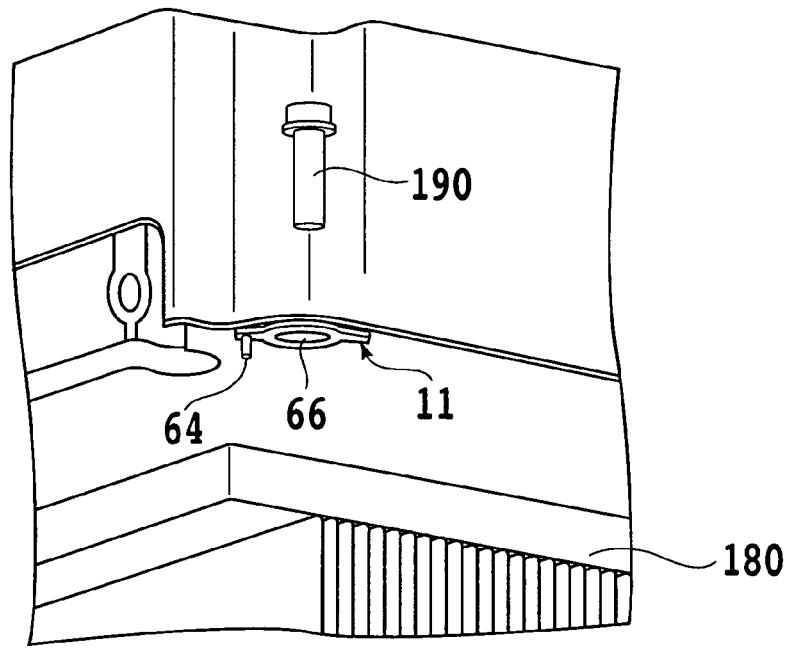
FIG. 13 is a perspective view showing the grounding of a ground line to a heat sink.

As shown in FIG. 13, a screw (ground connection conductive member) 190 is inserted through the hole of the mounting collar 66 for use with the connection of the ground line 11. Then, the screw 190 is inserted into the given tapped hole of the heat sink 180, thereby fixing the cover 50 to the heat sink 180 and simultaneously connecting the ground line 11 through the screw 190 to the heat sink 180. In this operation, the positioning pin 64 of the cover 50 is inserted through the hole 90 of the ground line 11, thereby preventing the misalignment of the ground line 11 in fixing the cover 50. Further, the flange of the cover 50 extends to the mounting surface of the heat sink 180, so that the cover 50 is closely attached to the heat sink 180, thereby obtaining a dustproof structure for the inverter.

(7) Mounting of the Auxiliary Cover 100

As shown in FIGS. 2A and 2B, a plurality of clips 104 are inserted through holes 102 of the auxiliary cover 100 and the holes 69 of the cover 50, thereby fixing the auxiliary cover 100 to the cover 50. Thus, the auxiliary cover 100 is mounted on the cover 50 to thereby obtain a dustproof structure for the inverter.

(8) Connection of the Input Lines 18

Figure 14:
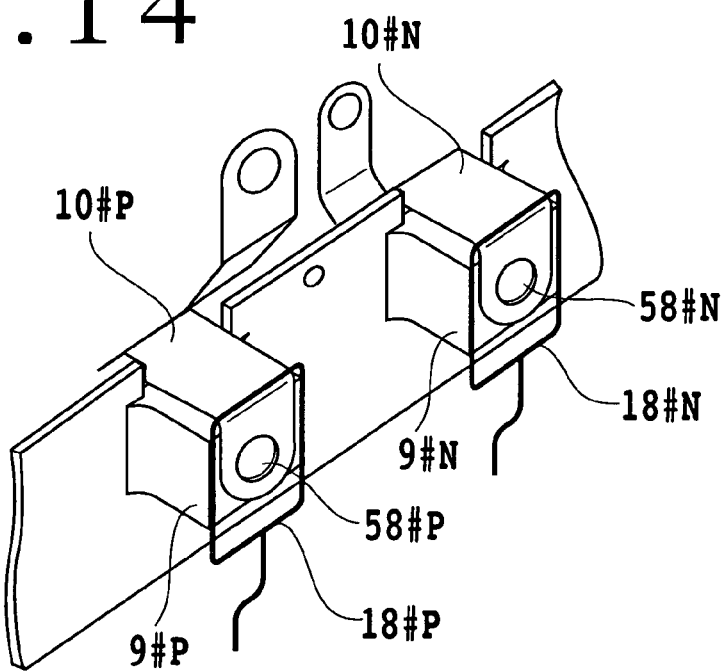
FIG. 14 is a perspective view showing the connection of the input terminal bases and input lines.

As shown in FIG. 14, the input lines 18#P and 18#N are fixed and connected to the input bus bars 10#P and 10#N by securing bolts to the nuts 58#P and 58#N in the input terminal bases 9#P and 9#N, respectively.

(9) Connection of the Output Lines 20

Figure 15:
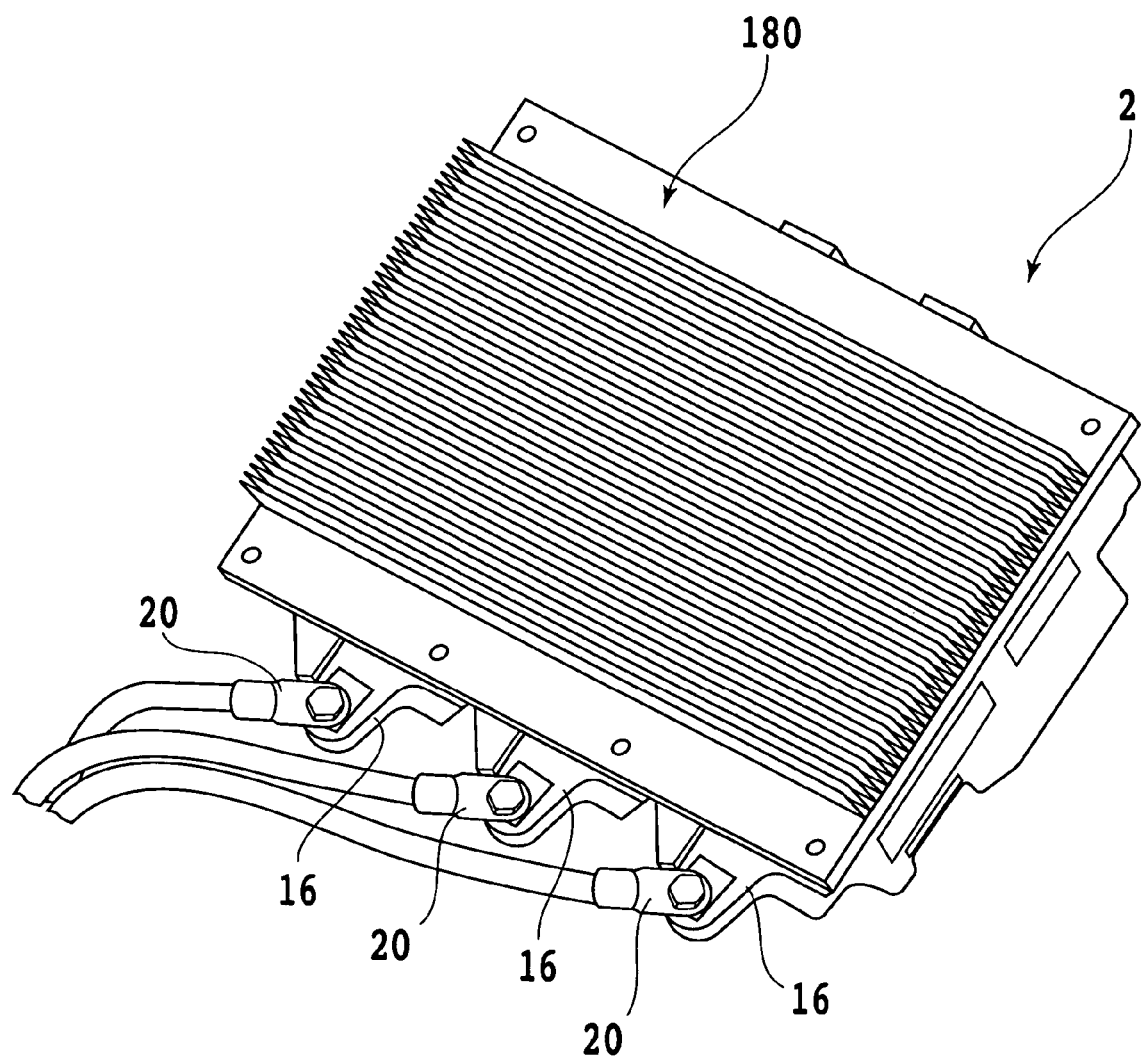
FIG. 15 is a perspective view showing the connection of output lines and the output terminal bases.
Figure 16A:
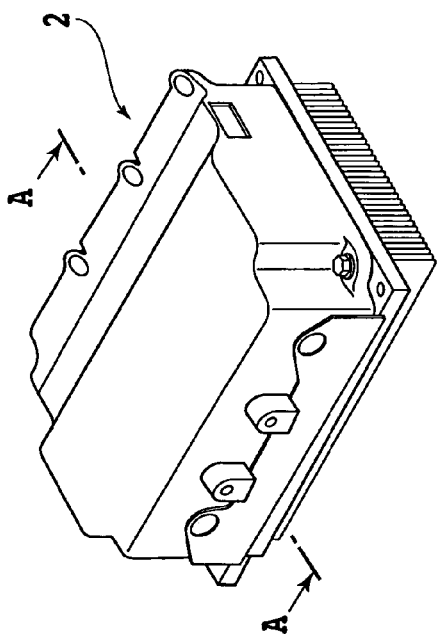
FIG. 16A is a perspective view of the inverter unit as viewed from one side of the cover.
Figure 16B:
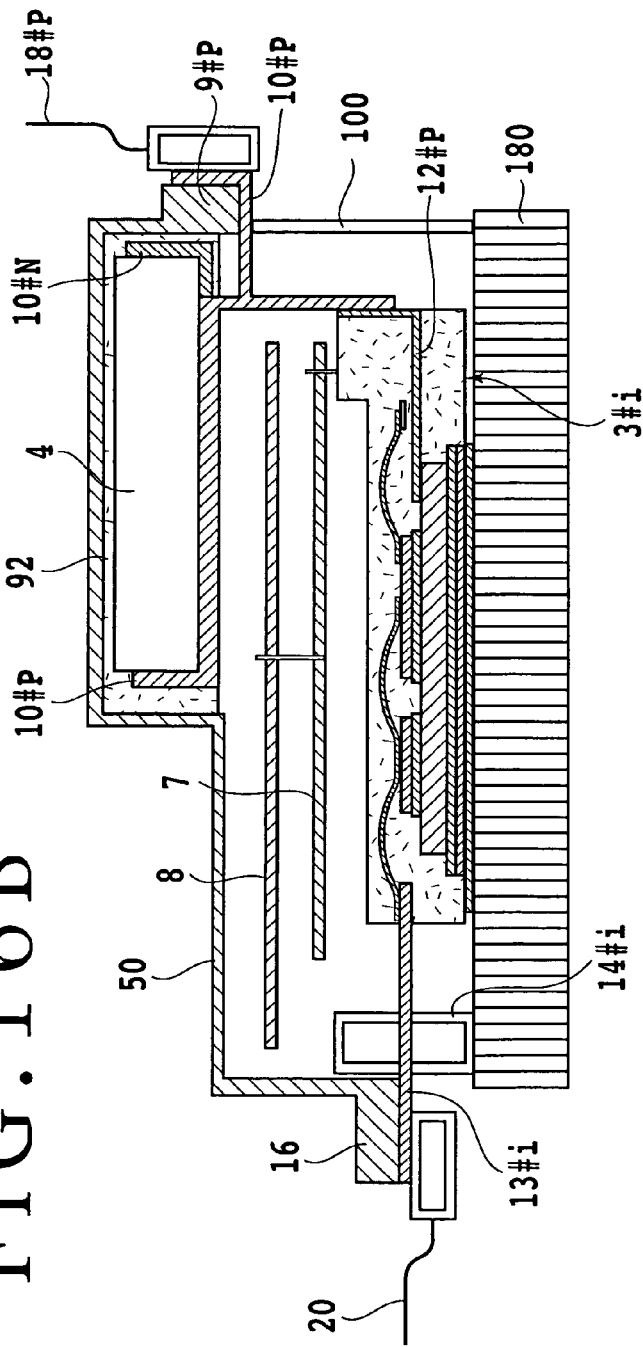
FIG. 16B is a cross section taken along the line A-A in FIG. 16A.

As shown in FIG. 15, the output lines 20 are fixed and connected to the SW module output bus bars 13 by securing bolts to the nuts 62 in the output terminal bases 16, respectively. FIG. 16A is a perspective view of the inverter unit 2 in its assembled condition as viewed from the first side of the cover 50, and FIG. 16B is a cross section taken along the line A-A in FIG. 16A. As shown in FIG. 16B, a current is supplied from the battery 1 through the input line 18#P (18#N), the input terminal base 9#P (9#N), and the input bus bar 10#P (10#N) to the smoothing capacitors 4, the C snubber 5, and the noise absorbing capacitors 6. Further, the current from the battery 1 is also supplied through the input line 18#P (18#N), the input terminal base 9#P (9#N), and the SW module input bus bars 12#P (12#N) to the SW modules 3#i (i=1, 2, 3).

Figure 17A:
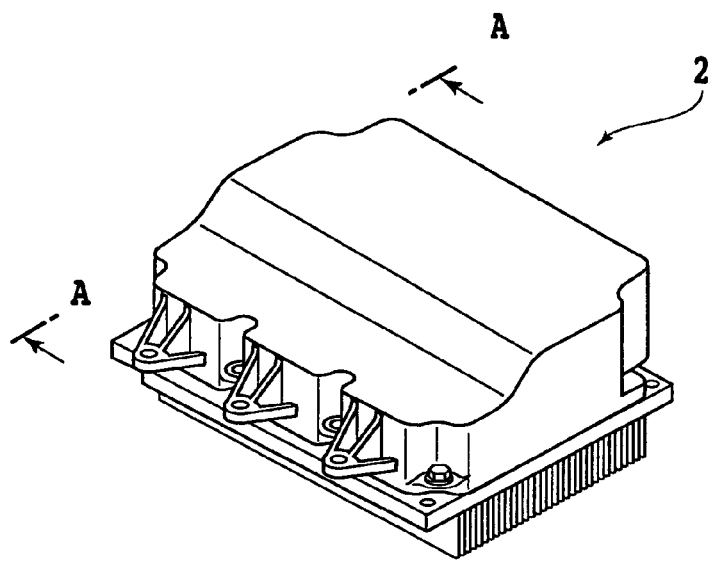
FIG. 17A is a perspective view of the inverter unit as viewed from another side of the cover.
Figure 17B:
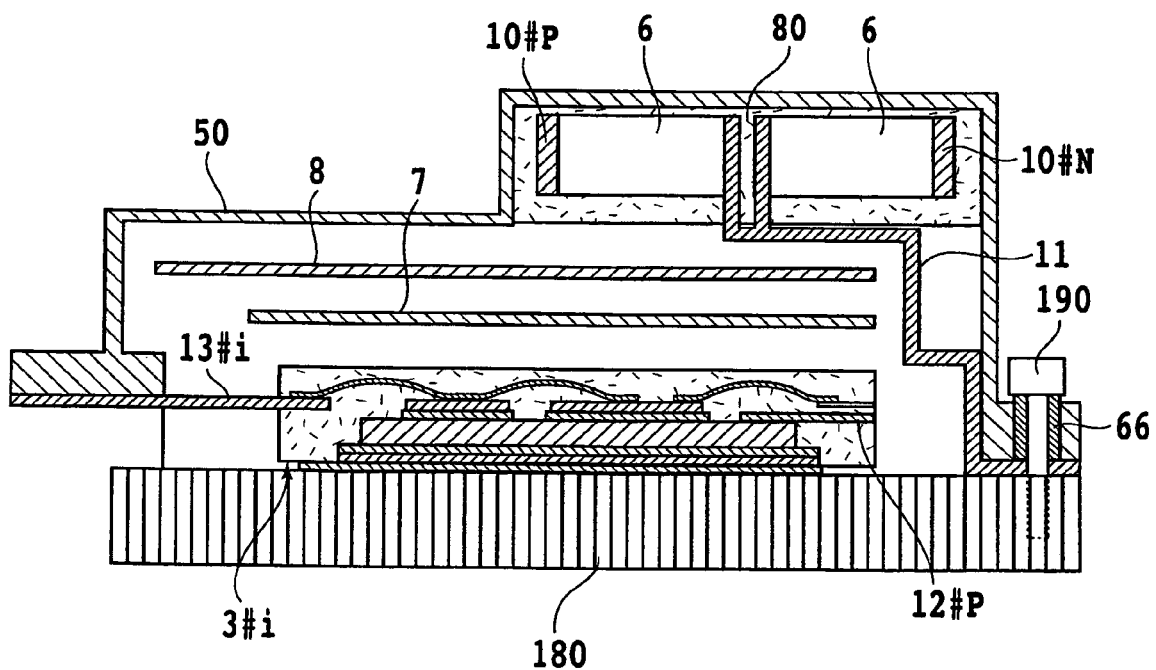
FIG. 17B is a cross section taken along the line A-A in FIG. 17A.
Figure 18:
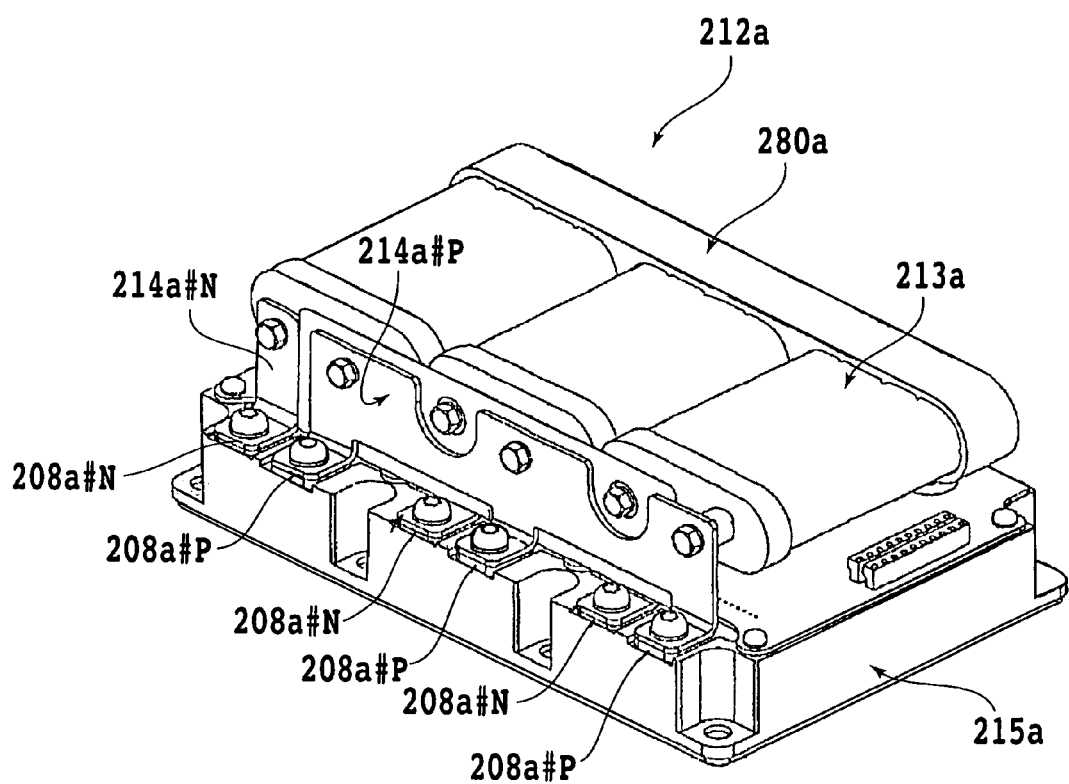
FIG. 18 is a view showing Related art 1.
Figure 19:
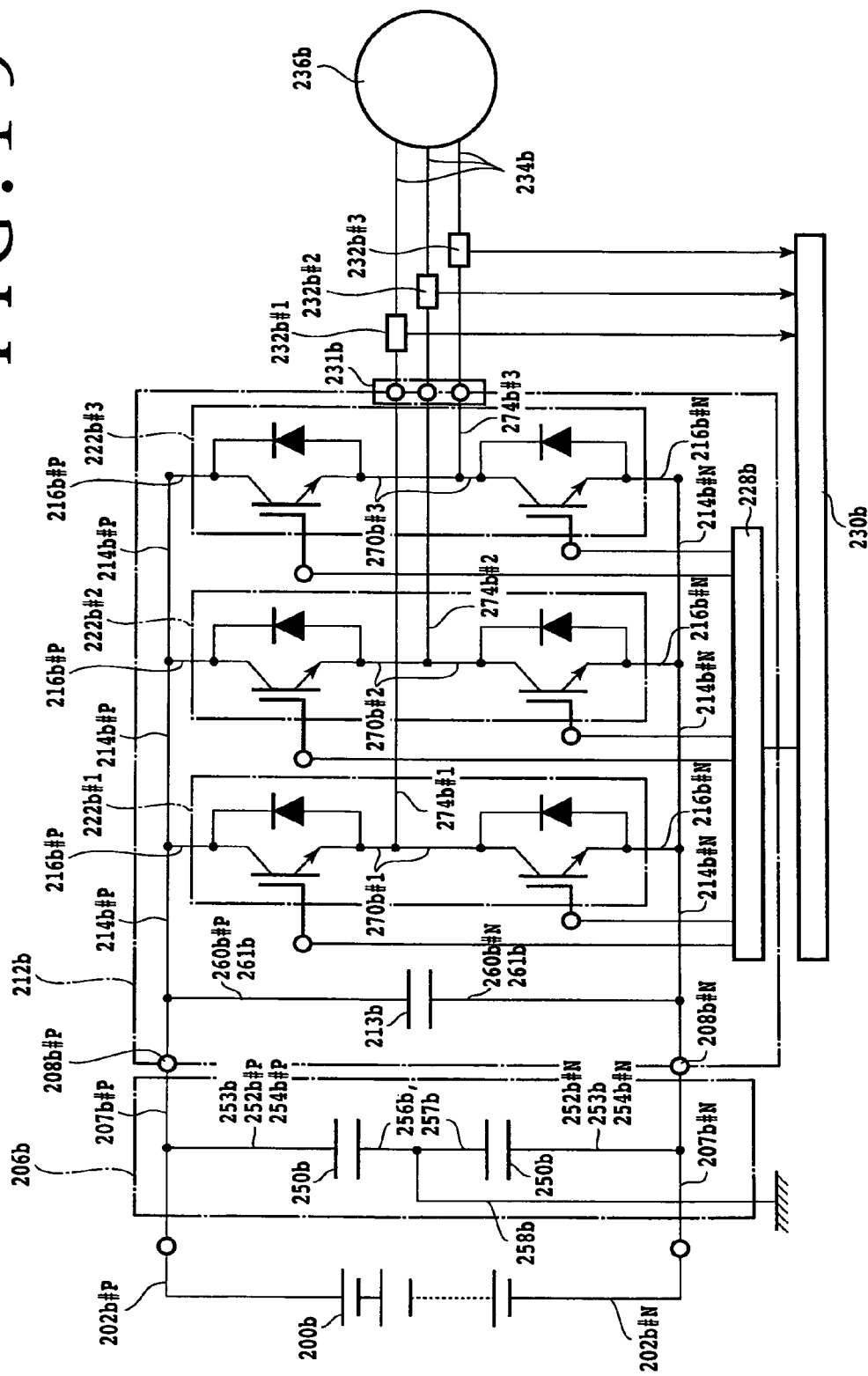
FIGS. 19 to 30 are views showing Related art 2.
Figure 20:
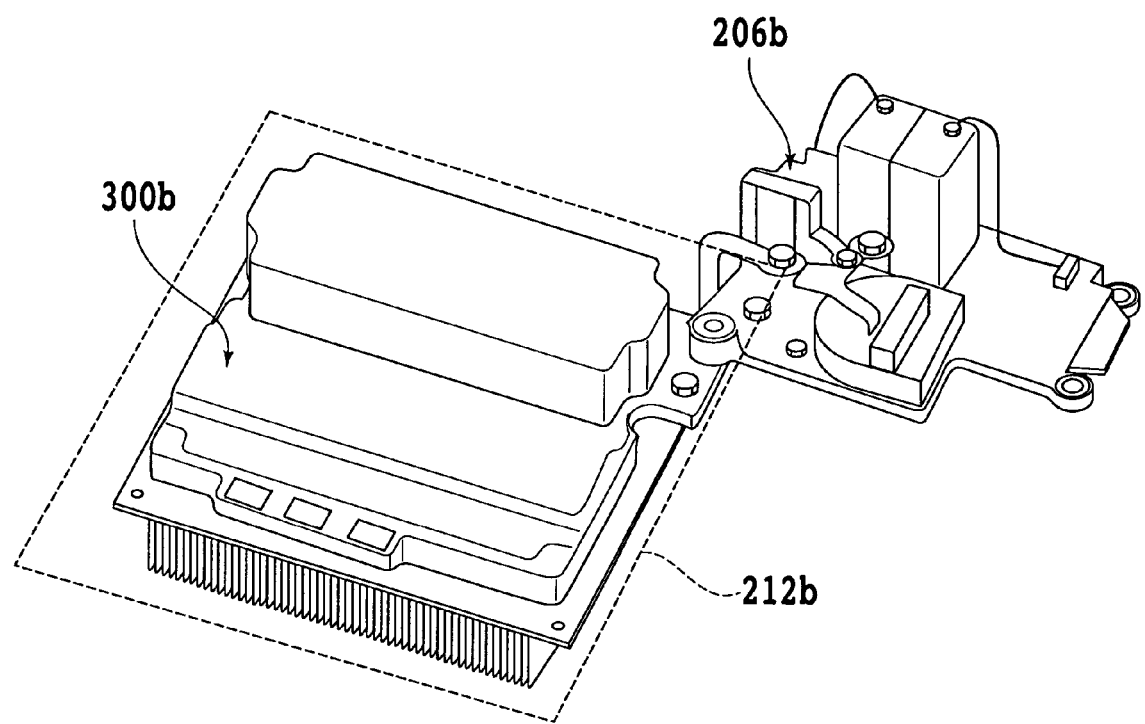
Figure 21:
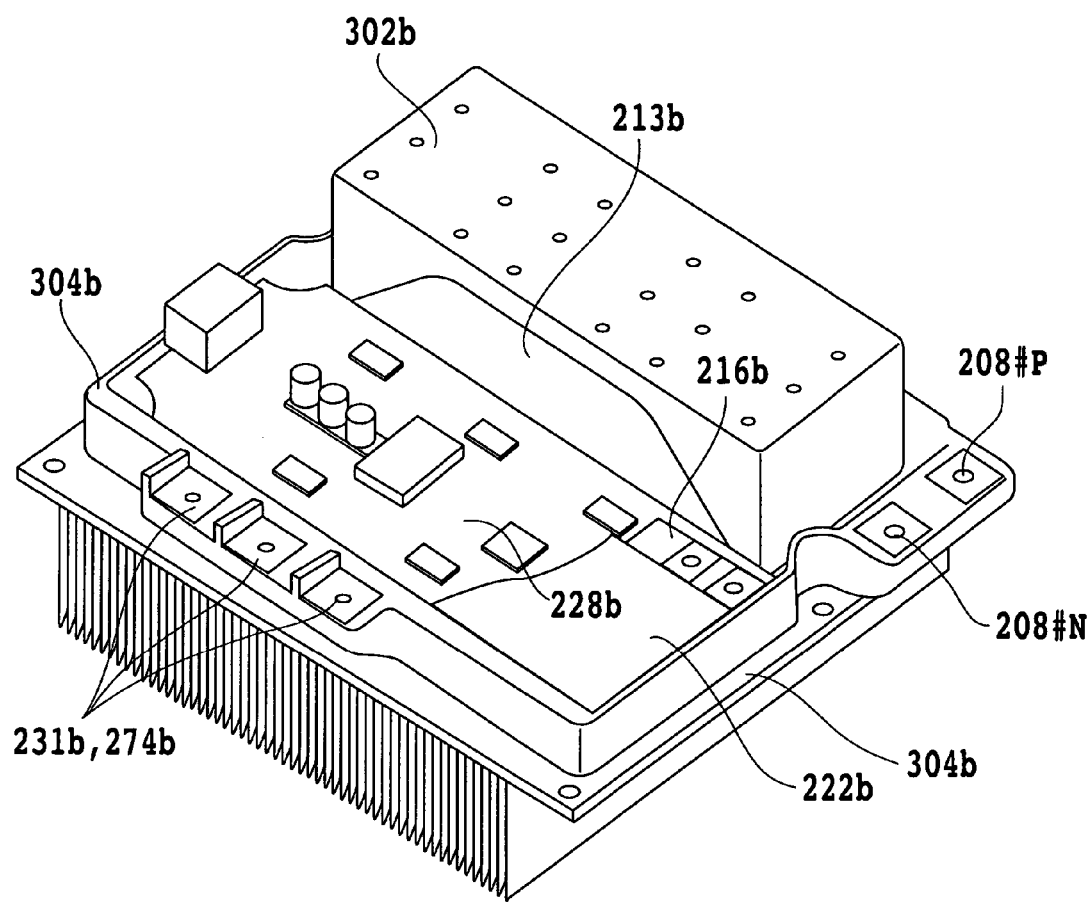
Figure 22:
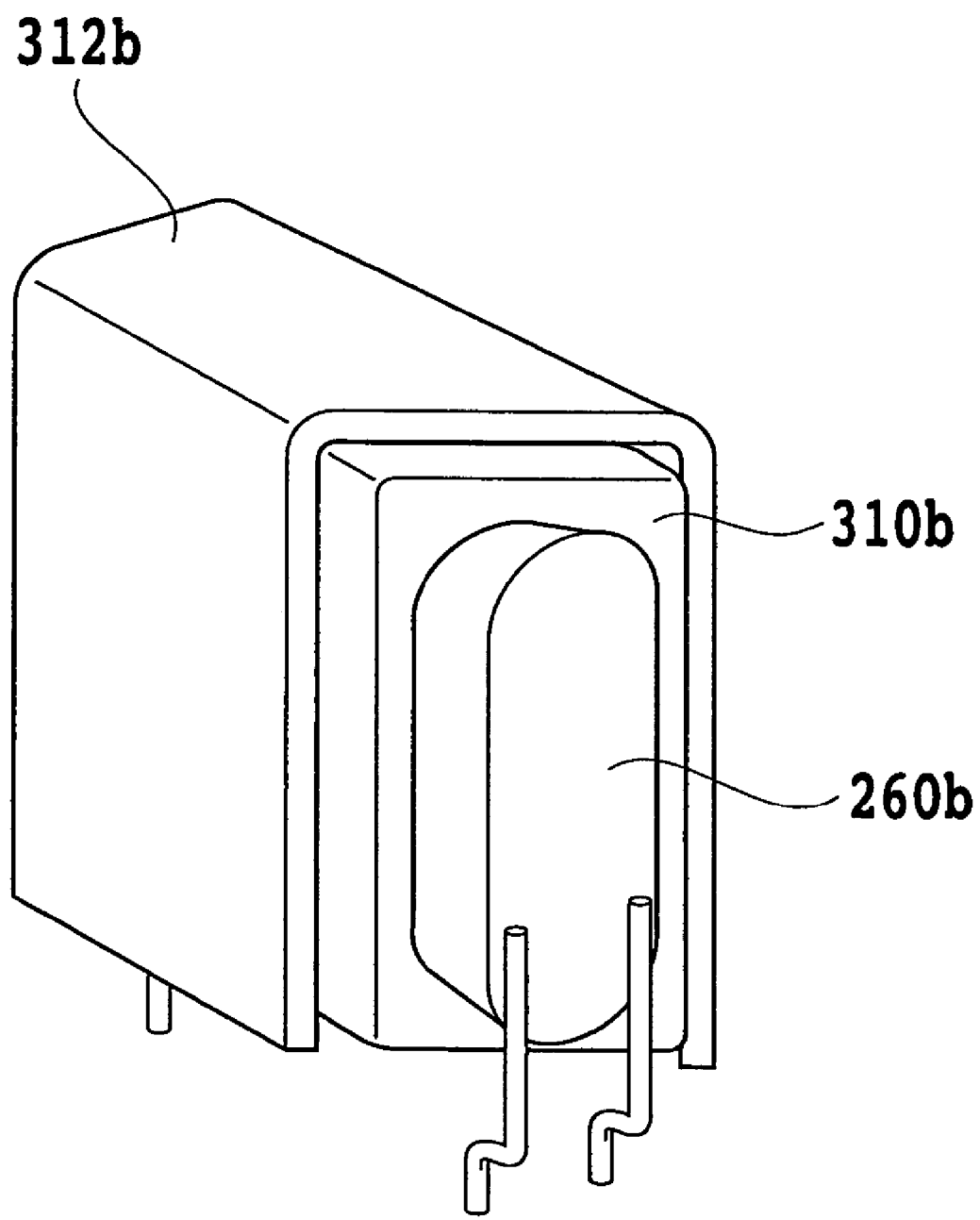
Figure 23:
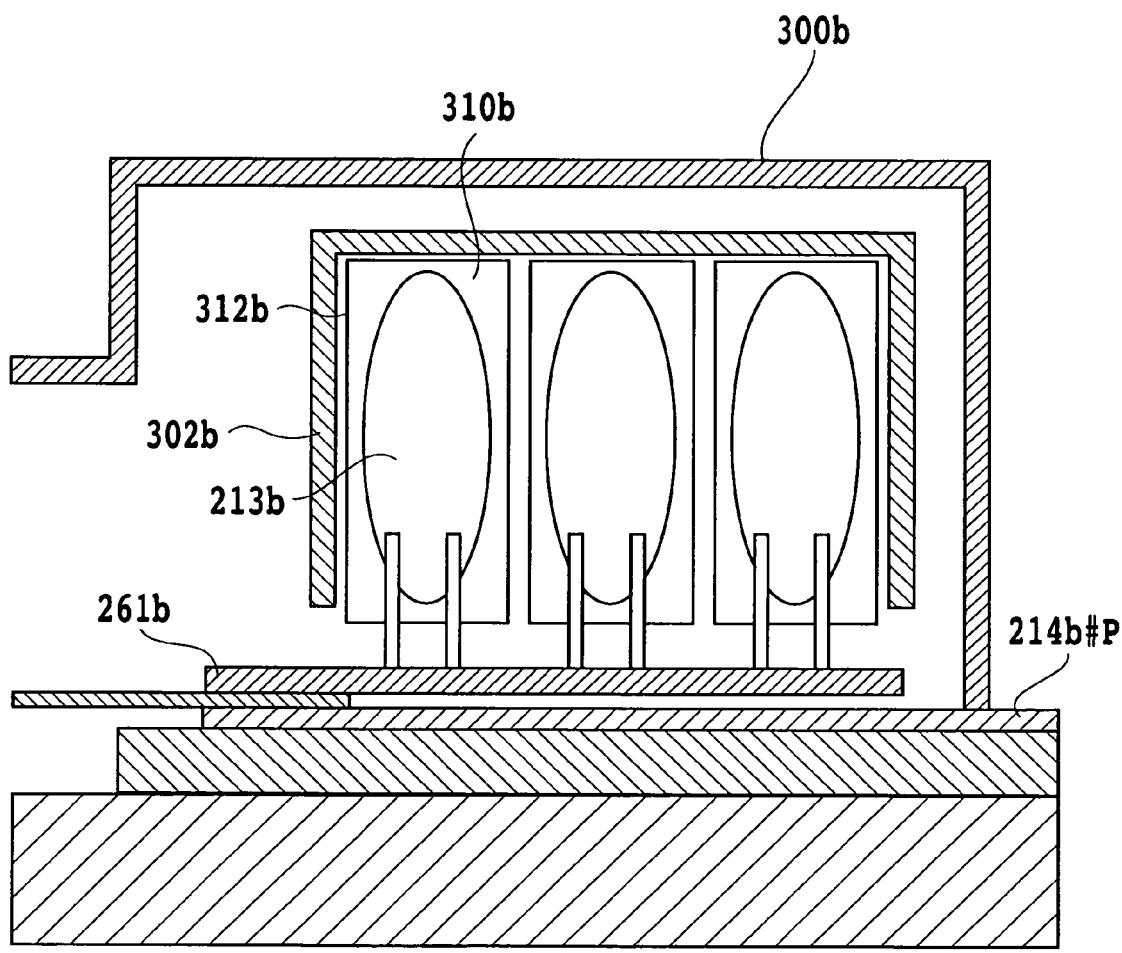
Figure 24:
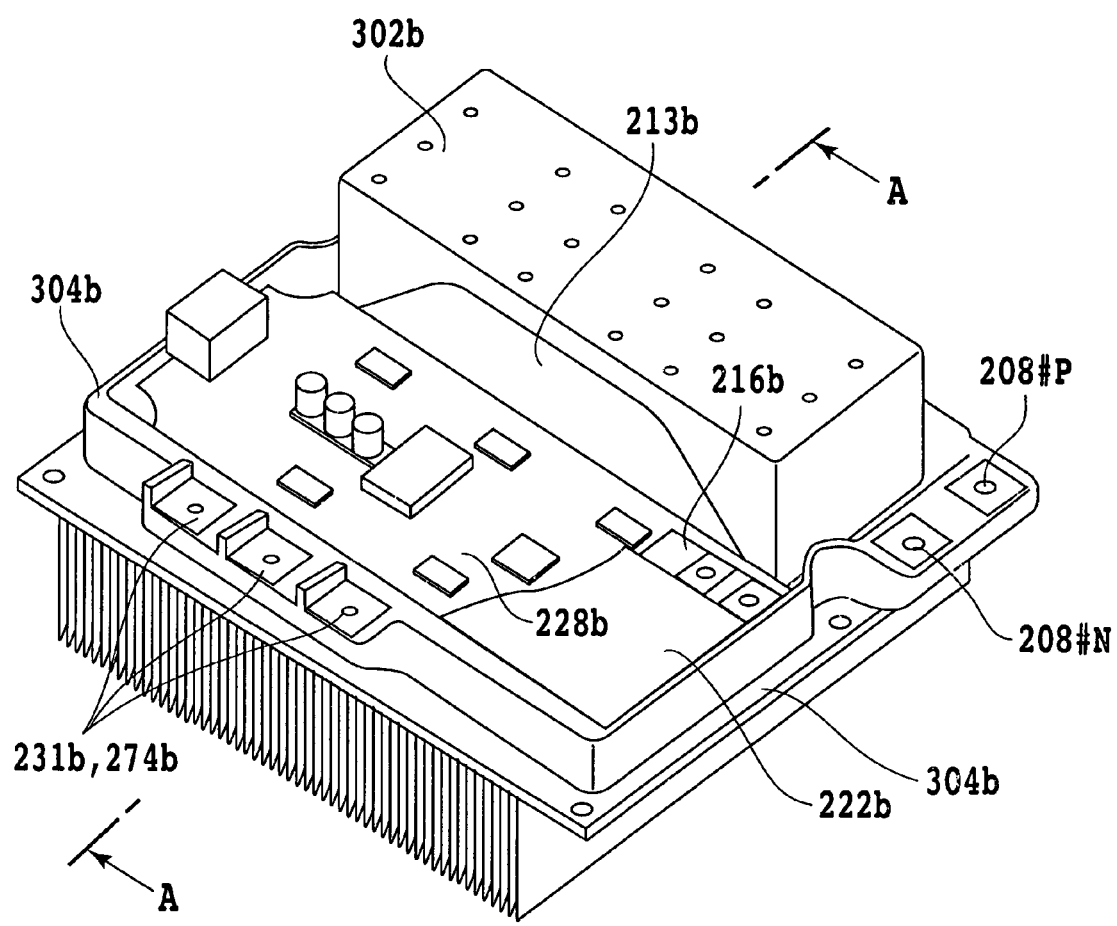
Figure 25:
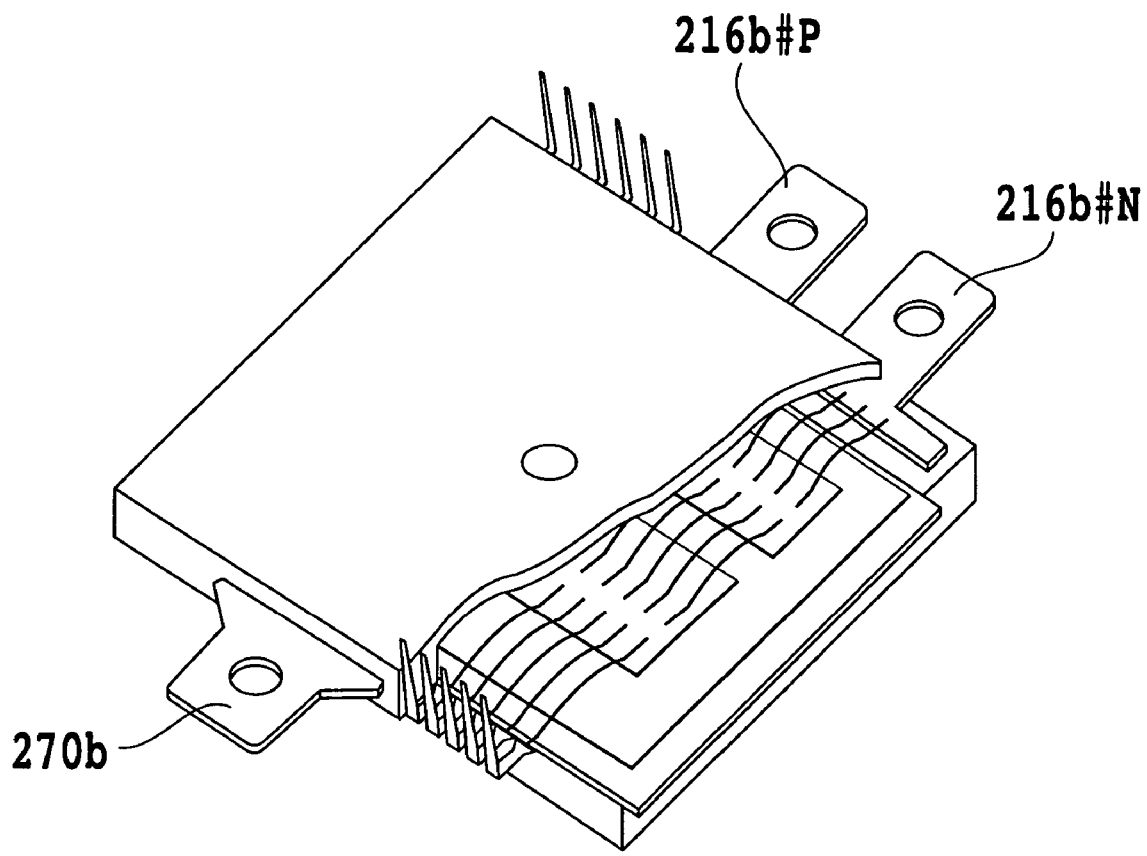
Figure 26:
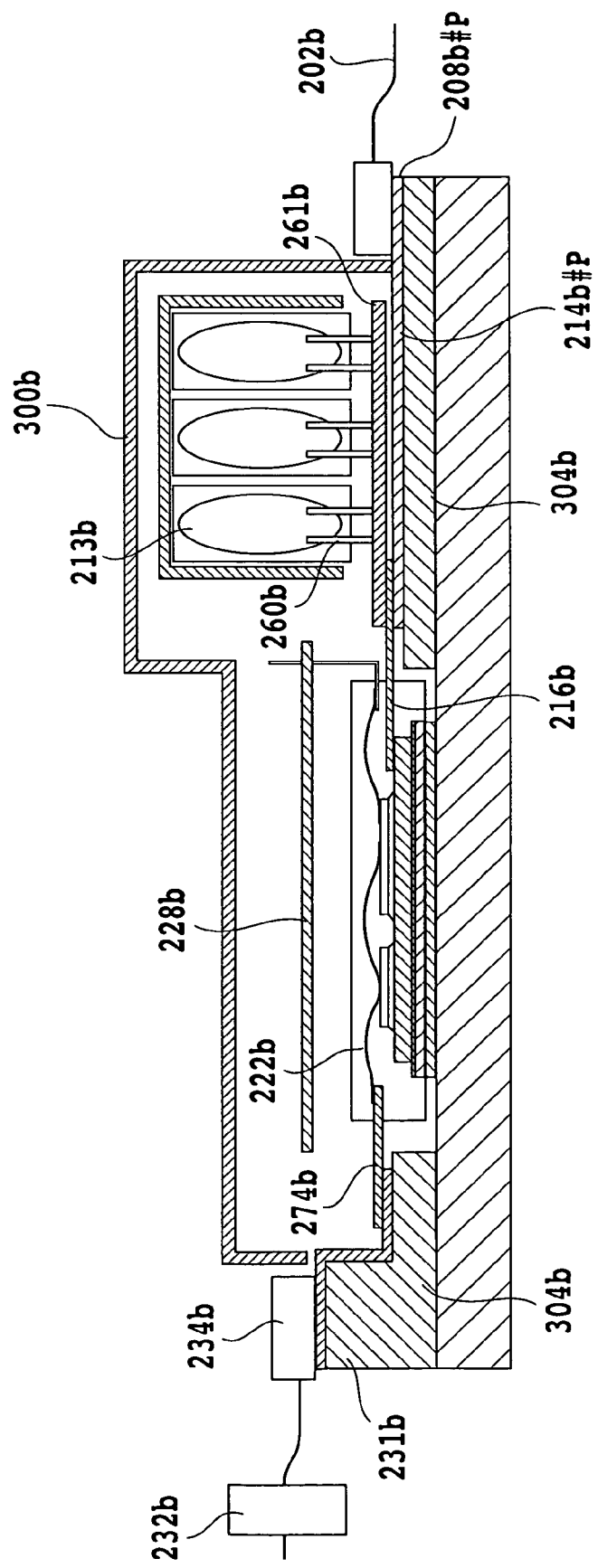
Figure 27:
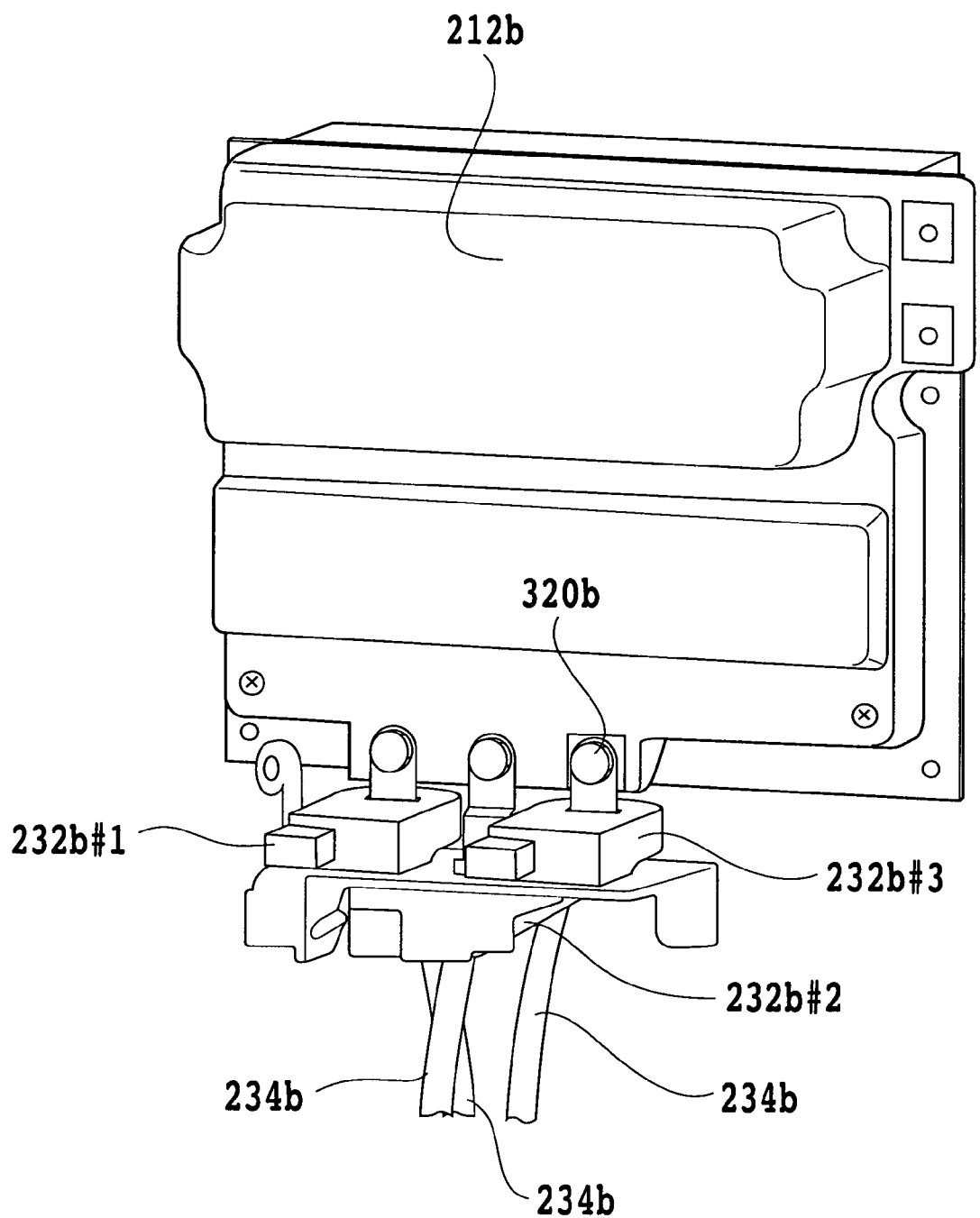
Figure 28:
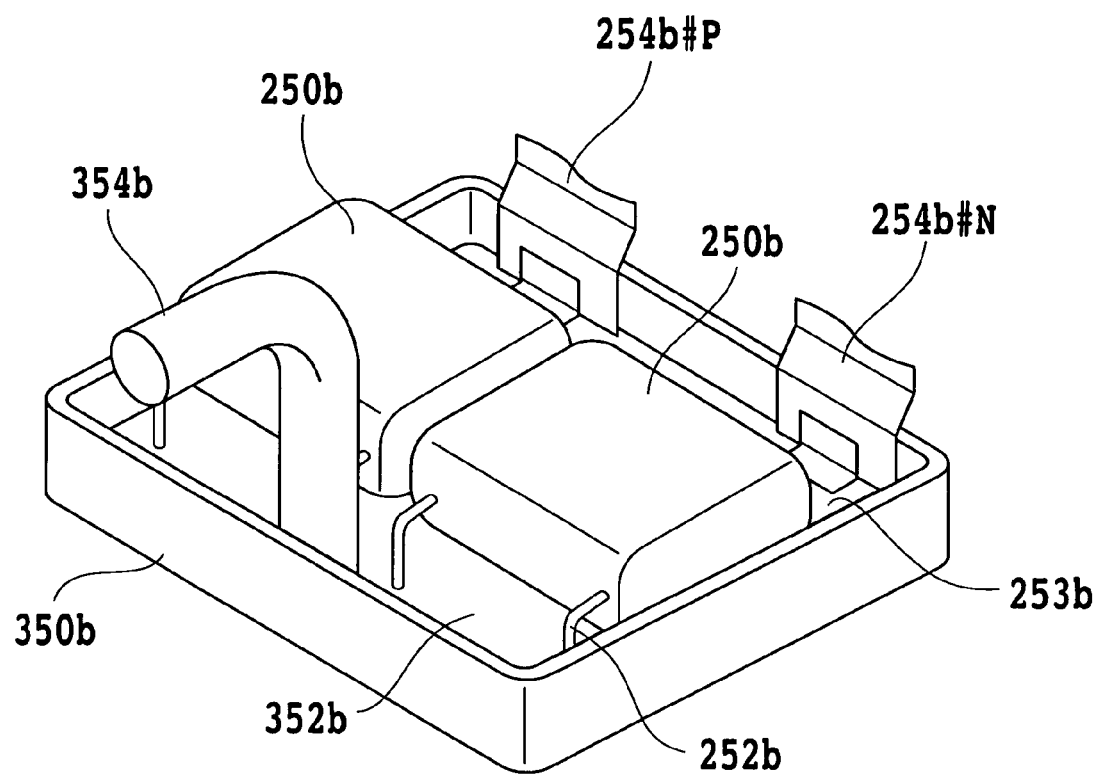
Figure 29:
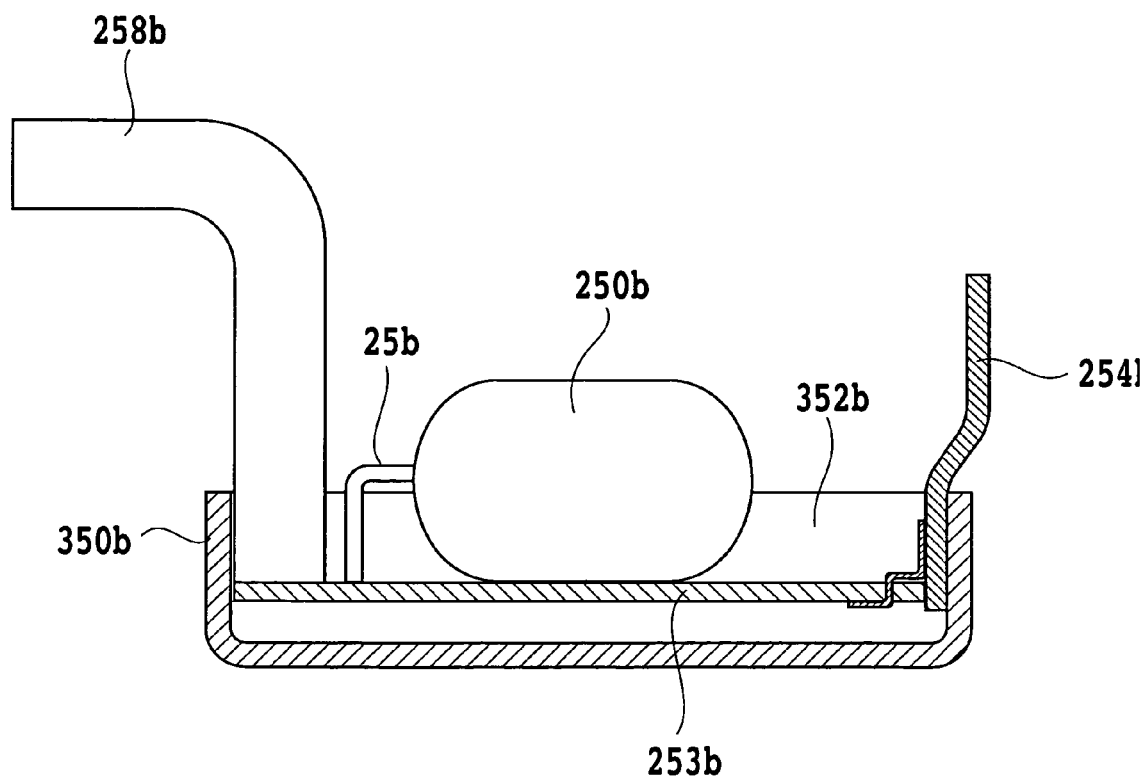
Figure 30:
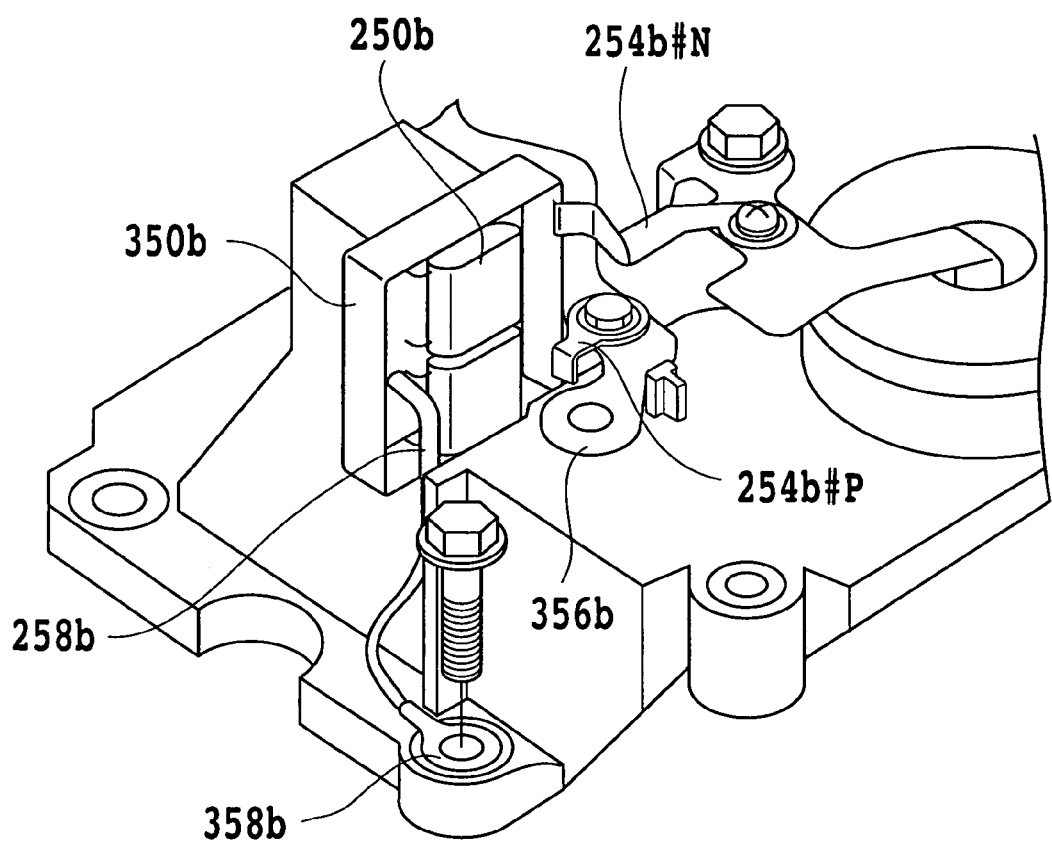
Figure 31:
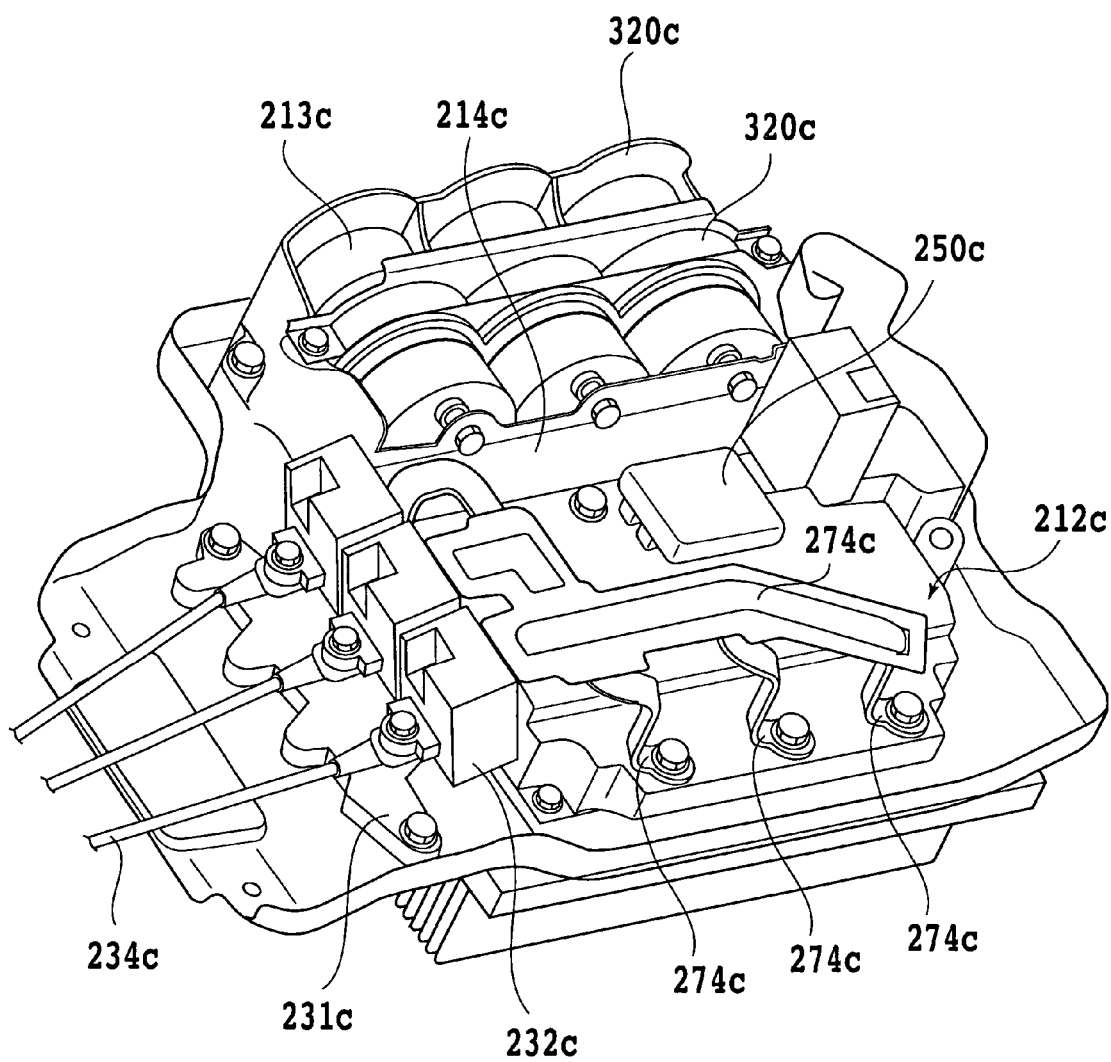
FIGS. 31 and 32 are views showing Related art 3.
Figure 32:
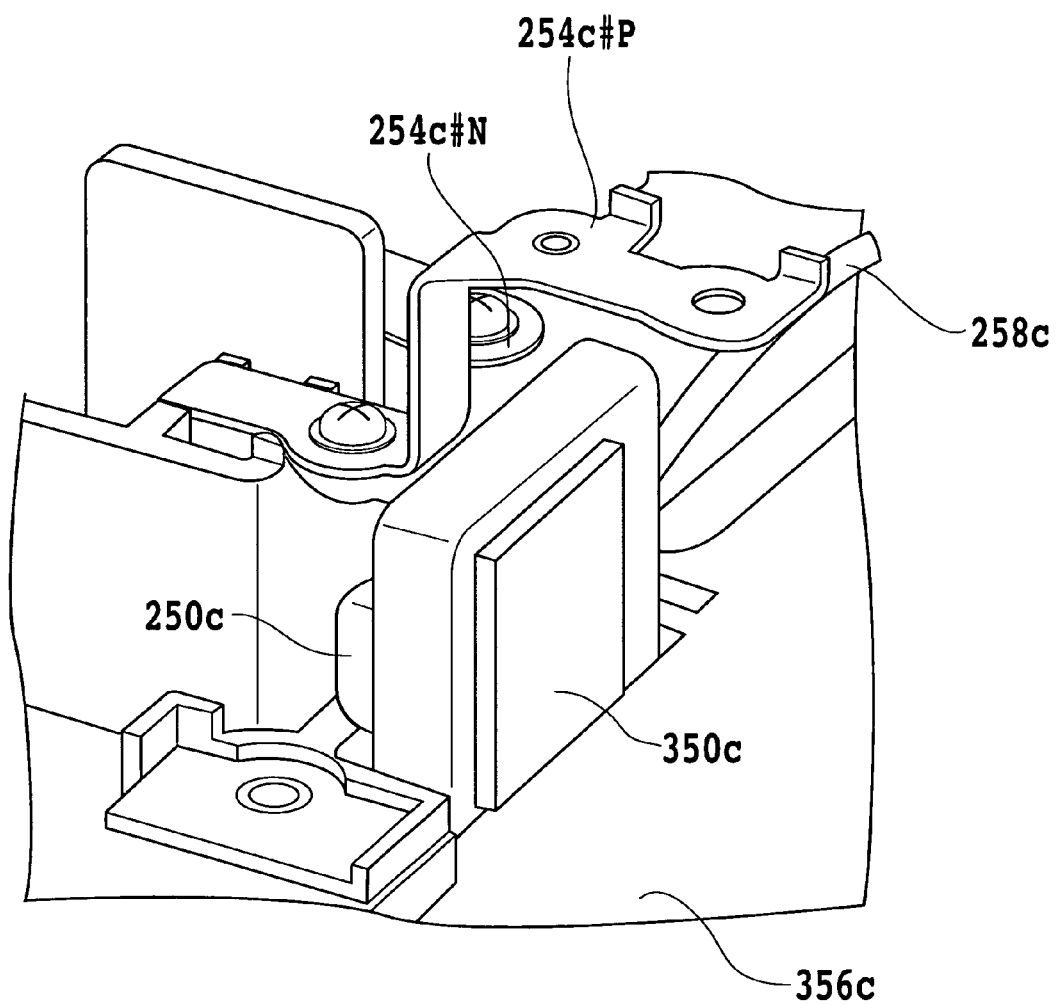

As shown in FIG. 16B, a three-phase AC voltage is output from the SW module output bus bars 13#i (i=1, 2, 3) through the current sensors 14#i (i=1, 2, 3) to the output lines 20. Each SW module 3#i has a multilayer structure consisting of a thermal compounder, lower base plate, insulating plate, upper base plate, chip, and resin layered from the lower side in this order. The chip is soldered to the upper base plate. FIG. 17A is a perspective view of the inverter unit 2 in its assembled condition as viewed from the second side of the cover 50, and FIG. 17B is a cross section taken along the line A-A in FIG. 17A. As shown in FIG. 17B, the opposed electrodes of the cascaded noise absorbing capacitors 6 are grounded through the ground line 11 and the screw 190 to the heat sink 180, so that a ground current flows from the opposed electrodes to the heat sink 180.

According to this preferred embodiment mentioned above, each of the input bus bars 10#P and 10#N is provided by a single member, thereby allowing a reduction in number of parts, a reduction in electrical contact resistance, and a reduction in number of soldering points. Further, the smoothing capacitors 4, the C snubber 5, and the noise absorbing capacitors 6 are assembled as a unit and they are accommodated and fixed in the recess 52 of the cover 50, thereby allowing a reduction in number of parts and a reduction in number of working steps. Further, owing to the function of the cover 50 as the input and output terminal bases and the extended shape of the flange of the cover 50, the number of parts can be reduced and the shape of the heat sink 180 can be made simple. Further, the opposed electrodes of the cascaded noise absorbing capacitors 6 are grounded to the heat sink 180 through the ground line 11 and the screw 190 inserted through the mounting collar 66 in the cover 50, and the ground line 11 is closely attached to the cover 50, so that the grounding length can be minimized and the number of working steps can be reduced.

If the ground line 11 is routed to the outside of the inverter unit 2 as in the related art, the grounding length becomes large and the inductance is therefore increased. Further, dedicated ground line securing positions must be set. According to this preferred embodiment, however, the ground line 11 can be connected to the heat sink 180 with a minimum length as satisfying the dustproof function of the cover 50. Further, the cover 50 is fixed to the heat sink 180 by the screw 190 and at the same time the noise absorbing capacitors 6 are electrically connected through the screw 190 to the heat sink 180, so that the number of working steps can be reduced. Accordingly, the volume, weight, and cost of the inverter can be greatly reduced.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A capacitor mounting type inverter unit having a cooling block, an inverter including a plurality of phases of switching circuits provided on said cooling block, and a smoothing capacitor, said inverter unit comprising:

a cover having a capacitor accommodating recess for accommodating said smoothing capacitor in the cover and an inverter accommodating recess for accommodating said inverter in the cover, said capacitor accommodating recess being filled with resin in the condition where said smoothing capacitor is accommodated in said capacitor accommodating recess; a platelike first conductive member connected to a positive electrode of said smoothing capacitor and a plurality of positive electrode connecting portions of said switching circuits; and a platelike second conductive member connected to a negative electrode of said smoothing capacitor and a plurality of negative electrode connecting portions of said switching circuits; said first conductive member having a plurality of first inverter connecting portions adapted to be connected to said positive electrode connecting portions of said switching circuits, respectively, said second conductive member having a plurality of second inverter connecting portions adapted to be connected to said negative electrode connecting portions of said switching circuits, respectively, and said first inverter connecting portions and said second inverter connecting portions being arranged in the vicinity of one side surface of said cover.

2. The capacitor mounting type inverter unit according to claim 1, wherein said capacitor accommodating recess having a depth larger than that of said inverter accommodating recess.

3. The capacitor mounting type inverter unit according to claim 1, wherein said cover has a first side surface integrally formed with a first input terminal base having a positive electrode connecting portion adapted to be connected to a positive electrode of a DC power supply and also integrally formed with a second input terminal base having a negative electrode connecting portion adapted to be connected to a negative electrode of said DC power supply, said first conductive member having a first input power connecting portion adapted to be connected to said positive electrode connecting portion of said first input terminal base, and said second conductive member having a second input power connecting portion adapted to be connected to said negative electrode connecting portion of said second input terminal base.

4. The capacitor mounting type inverter unit according to claim 3, further comprising a plurality of platelike inverter output conductive members respectively connected to the output terminals of said switching circuits, each of said inverter output conductive members having an inverter output connecting portion;

said cover having a second side surface different from said first side surface, said second side surface being integrally formed with a plurality of output terminal bases each having a motor connecting portion adapted to be connected to a motor; and said motor connecting portions of said output terminal bases being connected to said inverter output connecting portions of said inverter output conductive members, respectively.

5. The capacitor mounting type inverter unit according to claim 1, further comprising a noise absorbing capacitor accommodated in said capacitor accommodating recess, said noise absorbing capacitor being connected in parallel to said smoothing capacitor by said first conductive member and said second conductive member.

6. The capacitor mounting type inverter unit according to claim 5, wherein said noise absorbing capacitor comprises a plurality of cascaded capacitors;

said inverter unit further comprising a platelike intermediate conductive member connected to electrodes of said capacitors except the opposite ones of said capacitors, said intermediate conductive member having a first hole adapted to be aligned with a second hole of a grounding terminal provided at a peripheral portion of said cover, and said intermediate conductive member being connected and fixed to said cooling block by a ground connection conductive member inserted through said first hole and said second hole.

7. The capacitor mounting type inverter unit according to claim 6, further comprising positioning means for positioning said intermediate conductive member in the vicinity of said second hole of said cover.

8. The capacitor mounting type inverter unit according to claim 1, wherein said cooling block comprises a heat sink having a flat metal plate and a plurality of fins provided on said flat metal plate;

said cover having a flange closely attached and fixed to a peripheral portion of said flat metal plate of said heat sink.

* * * * *